United States Patent [19]

Matsuura

[11] Patent Number: 5,796,674
[45] Date of Patent: Aug. 18, 1998

[54] SIGNAL TRANSITION DETECTION CIRCUIT

[75] Inventor: Yoshiaki Matsuura, Nara, Japan

[73] Assignee: Sharp Kabushiki Kaisha, Osaka, Japan

[21] Appl. No.: 767,451

[22] Filed: Dec. 16, 1996

[30] Foreign Application Priority Data

Mar. 22, 1996 [JP] Japan ................................ 8-066871

[51] Int. Cl.$^6$ ........................................................ G11C 8/00
[52] U.S. Cl. ............................................ 365/233.5; 326/93
[58] Field of Search .................................... 365/233.5, 233; 326/93–98; 327/22, 23, 24, 20, 18, 77, 78

[56] References Cited

U.S. PATENT DOCUMENTS

| | | | |
|---|---|---|---|
| 5,159,574 | 10/1992 | Kim | 327/23 |
| 5,198,709 | 3/1993 | O'Connell | 326/98 |
| 5,306,963 | 4/1994 | Leak | 326/93 |
| 5,587,673 | 12/1996 | MacDonald | 326/98 |

FOREIGN PATENT DOCUMENTS 60-187993  9/1985  Japan.
4-74381   3/1992  Japan.

*Primary Examiner*—A. Zarabian
*Attorney, Agent, or Firm*—Morrison & Foerster LLP

[57] ABSTRACT

A set of series-connected N-MOSFETs 1, 3 and a set of series-connected N-MOSFETs 2, 4 are connected in parallel with each other between a pull-up node e1 of a P-MOSFET 5 and a GND. A set of series-connected P-MOSFETs 11, 13 and a set of series-connected P-MOSFETs 12, 14 are connected in parallel with each other between a power source VDD and a pull-down node f1 of an N-MOSFET 15. The pull-down node f1 is connected to the gate of an N-MOSFET 16, and the pull-up node e1 is connected to the input gate of an inverter 17. The transition of the signal inputted to each transistor is detected thereby to generate a pulse signal at the output OUT of the inverter. Gate signal b1 is delayed behind gate signal a1 by an amount of one inverter stage, gate signal c1 is delayed behind gate signal a1 by an amount of three inverter stages, and gate signal d1 is delayed behind gate signal b1 by an amount of three inverter stages. A signal with a sufficient pulse width can thus be generated against a thin input pulse without extending the pulse width or shaping of waveform in the preceding stage.

11 Claims, 17 Drawing Sheets

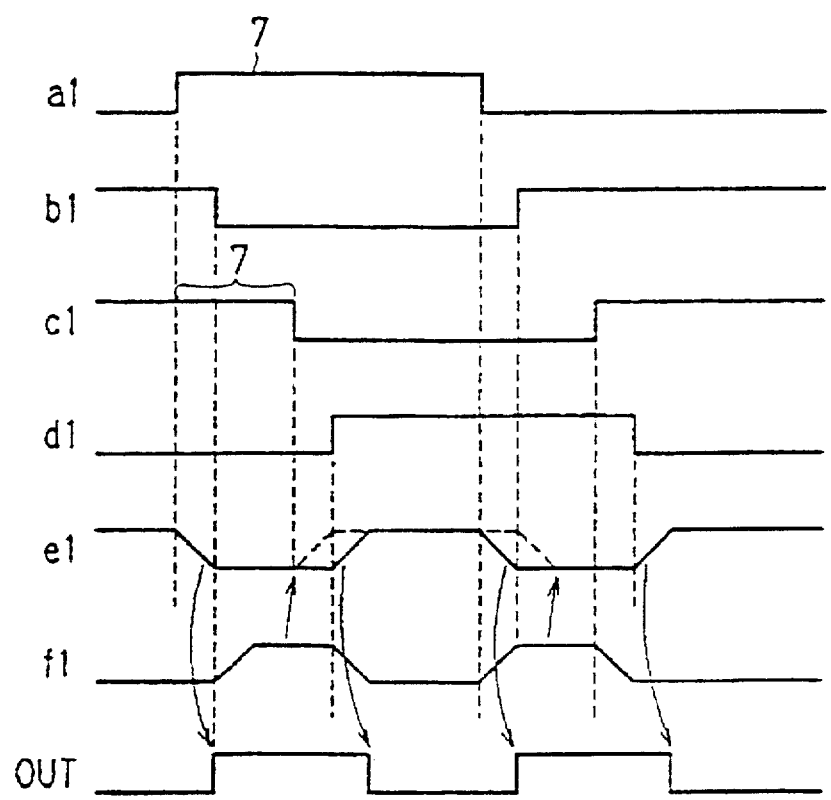

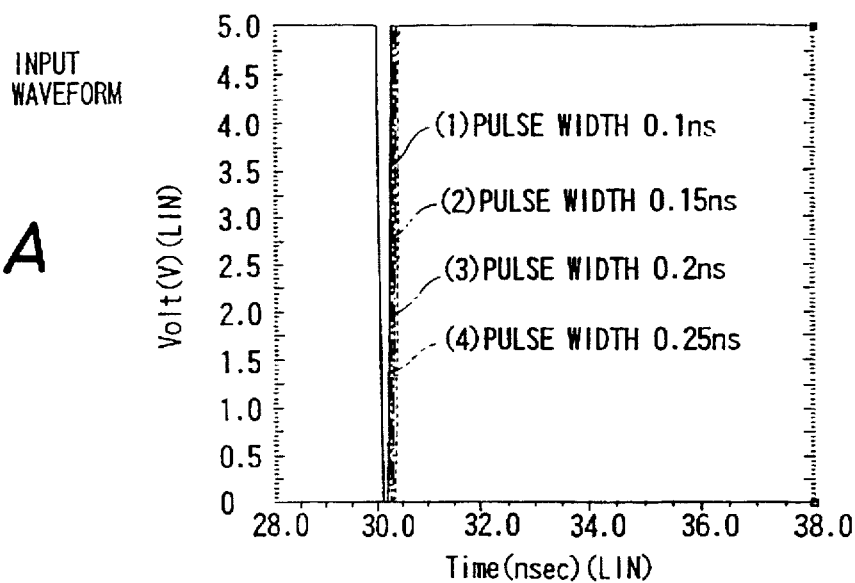
FIG. 3A — INPUT WAVEFORM
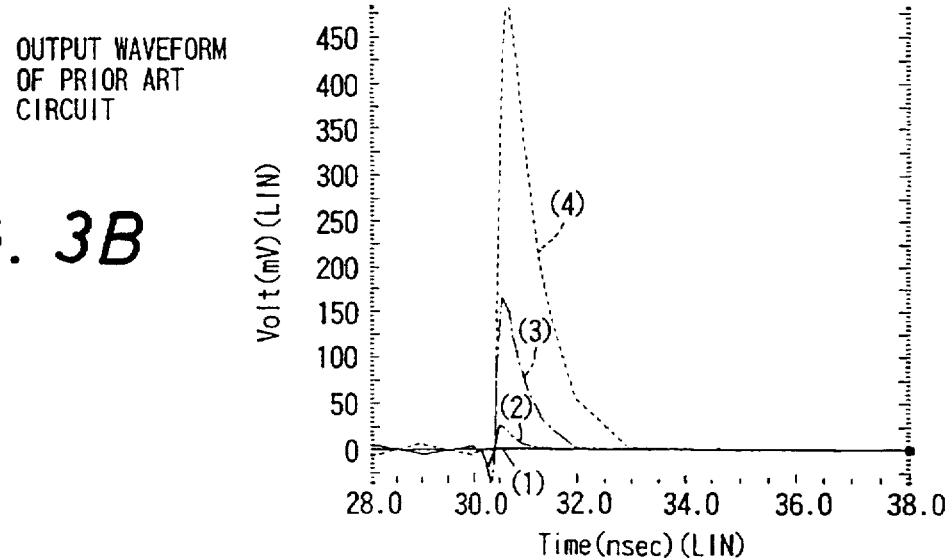
FIG. 3B — OUTPUT WAVEFORM OF PRIOR ART CIRCUIT
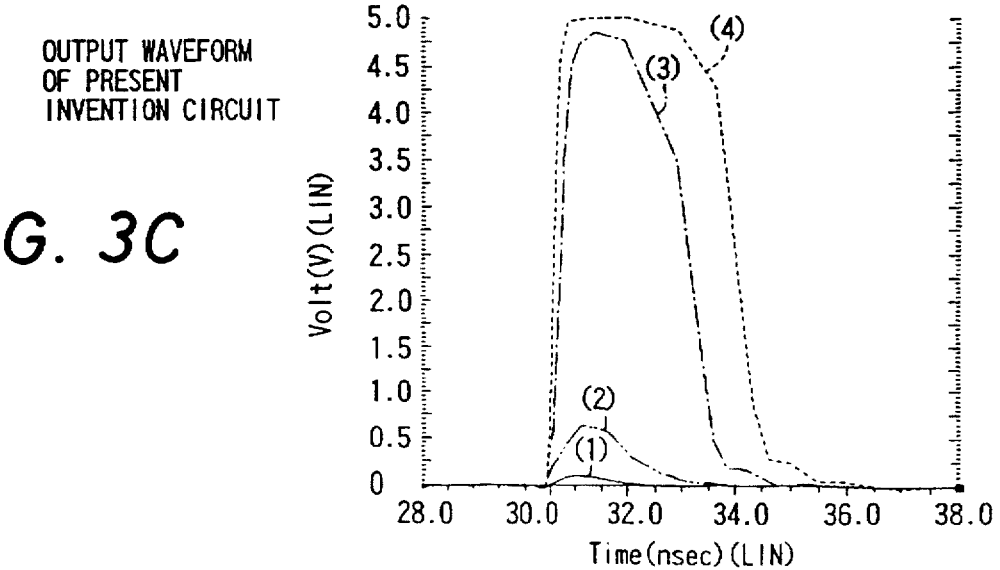
FIG. 3C — OUTPUT WAVEFORM OF PRESENT INVENTION CIRCUIT

FIG. 5
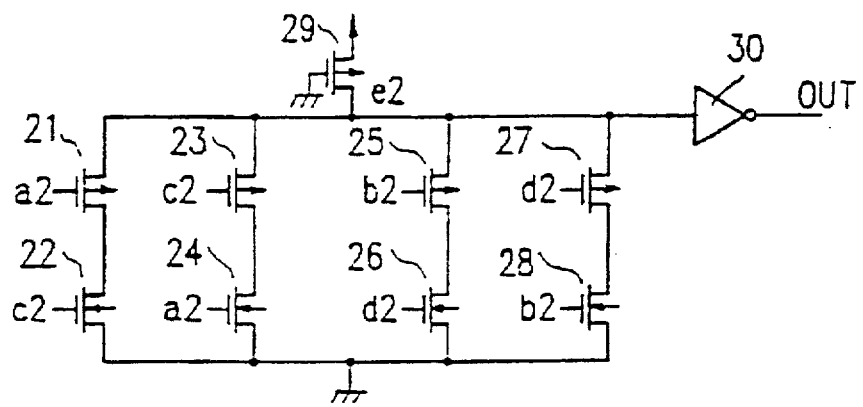
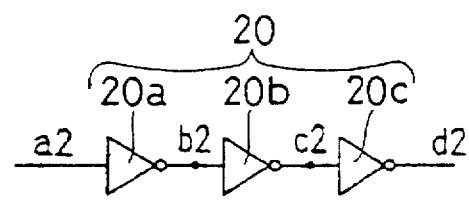
FIG. 6
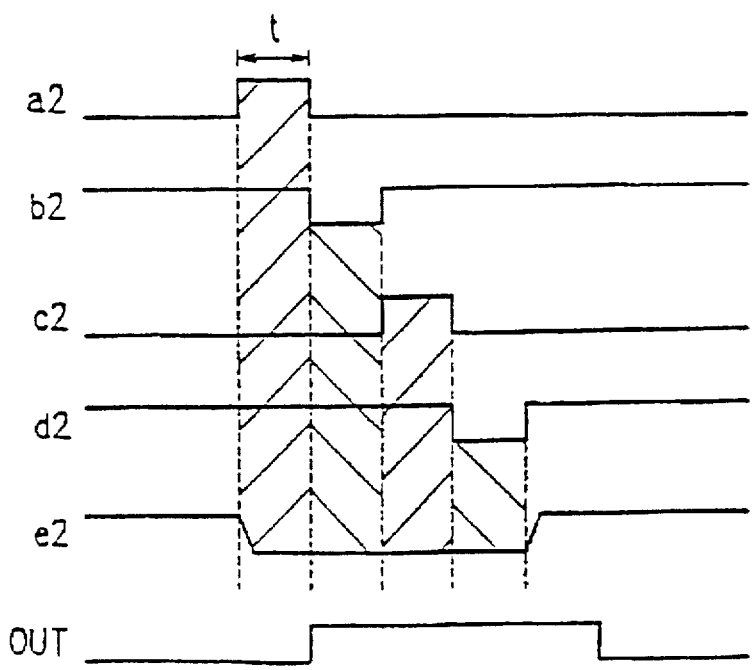

FIG. 18
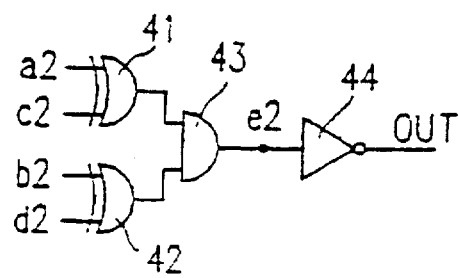
FIG. 19
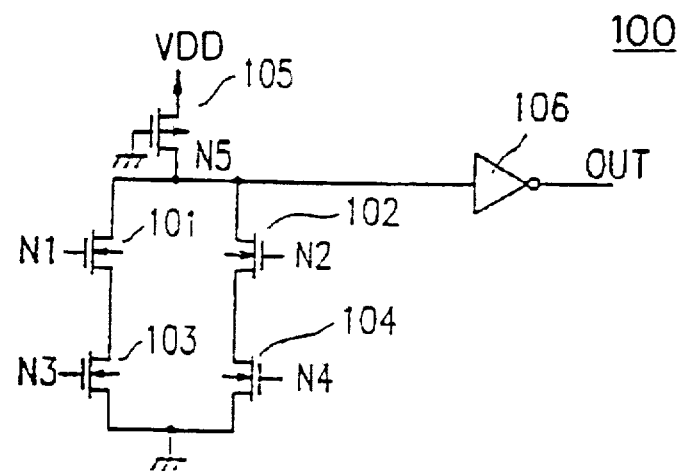
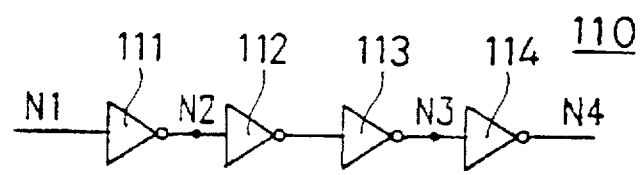

SIGNAL TRANSITION DETECTION CIRCUIT

BACKGROUND OF THE INVENTION

1. Field of the Invention

The present invention relates to a signal transition detection circuit for detecting the transition of an input signal such as an input address of a semiconductor memory device like a DRAM, a SRAM or an EPROM.

2. Description of the Related Art

There is known a signal transition detection circuit which is shown in FIG. 19 as a prior art mentioned above. In this signal transition detection circuit 100, two N-type MOSFETs (Metal Oxide Semiconductor Field Effect Transistor) 101, 103, whose gates are supplied with signals N1 and N3 respectively, are connected in series between a drain electrode of the pull-up P-type MOSFET 105 (Metal Oxide Semiconductor Field Effect Transistor) and a GND, two N-type MOSFETs 102, 104, whose gates are supplied with signals N2 and N4 respectively, are connected in series between the drain electrode of the pull-up P-type MOSFET 105 and the GND, and the two series of N-type MOSFETs 101, 103; 102, 104 are connected in parallel. A gate electrode of the pull-up P-MOSFET 105 is connected to the GND and equivalently functions as a load resistor, and the pull-up node thereof (signal N5) is normally charged to "H" level. This signal N5 is supplied to an inverter 106, which produces an output signal OUT inverted from the input signal. A source electrode of the P-MOSFET 105 is connected to a positive power supply line VDD.

The signal supplied to this signal transition detection circuit is generated by a delay circuit 110 as shown in FIG. 19. Specifically, signal N3 is delayed behind signal N1 in three stages delay due to three inverter 111, 112, 113. Signal N4, on the other hand, is delayed behind signal N2 in three stages due to three inverter 112, 113, 114. Signal N2 is an output which is obtained by inversion of signal N1 by the inverter 111.

FIG. 20 is a timing chart of this signal transition detection circuit. Signal N1, as shown in FIG. 20, changes from L through H to L level. On the other hand, signal N2 changes from H through L to H level after being delayed by an amount of one inverter stage. Also, signal N3 changes from H through L to H level after being delayed behind signal N1 by an amount of three inverter stages. Signal N4 undergoes a change from L through H to L level after being delayed behind signal N1 by an amount of four inverter stages.

Under this condition, when signal N1 has transited from L to H level, signal N3 is delayed by an amount of three inverter stages and is in H level state. Therefore, since both signals N1 and N3 are in H level state for a certain period, during which the two series-connected N-type MOSFETs 101, 103 whose gates are supplied with signals N1 and N2, respectively, are turned on, the charge of the pull-up node providing signal N5 is discharged and the potential thereof assumes L level. After that, when signal N3 changes from H to L level, the N-MOSFET 103 turns off, and the pull-up node providing signal N5 is charged again. In this way, the level of signal N5 temporarily becomes L level, and thereby an inverter 106 produces an output signal OUT providing a H level pulse. Since the equivalent resistance value of the P-MOSFET 105 is comparatively large, the charge and discharge operation of the pull-up node consumes a considerable time with a gentle inclination of transition. The output of the inverter 106 sharply changes about a threshold value thereof, and therefore the output signal OUT changes steeply, too.

Upon subsequent transition of signal N1 from H to L level, signal N2 changes from L to H level while signal N4 changes from H to L level. In the process, signal N4 is delayed behind signal N2 by an amount of three inverter stages. The potentials of both signals N2 and N4 remain at H level for a certain period, and the two series connected N-type MOSFETs 102, 104 whose gates are supplied with the signals N2, N4, respectively, are both turned on. The charge of the pull-up node providing signal N5, therefore, is discharged and the potential assumes L level. After that, upon transition of signal N4 from H to L level, the N-MOSFET 104 turns off, so that the pull-up node providing signal N5 is charged again. Since signal N5 temporarily assumes L level in this way, an inverter 106 outputs a signal OUT which is also a H level pulse.

FIG. 21 is a timing chart for this signal transition detection circuit in which signal N1 changes from H through L to H level. Also in this case, the inverter 106 produces an output signal OUT in similar fashion.

In the case where the above-mentioned signal transition detection circuit is used as an address transition detector (hereinafter referred to as "the ATD circuit") and is connected to an input address circuit of a semiconductor memory such as DRAM, SRAIM or E²PROM, a detection signal is generated with the transition of an input address. It is therefore possible to access data in accordance with the address transition by the use of this detection signal.

FIG. 22 shows an example connection in such a case. FIG. 23 is a timing chart of the operation. An input address passes through a latch 122 of an address buffer 120 and is inputted to the ATD circuit 130 when the control signals øA and øA of the gate 121 of the address buffer 120 are of L and H levels, respectively. As a result, with the transition of the input address at time point t1, the ATD signal making up an address transition detection signal is outputted. Also, the input address is latched in the latch 122 of the address buffer 120 at time point t2 when the control signals øA and øA of the address buffer 120 change to H and L levels, respectively. The input signal N1 of the ATD circuit 130 thus assumes a predetermined logic value.

In FIG. 23, however, assume that the H level input address, after being latched as signal N1 in the latch 122 at time point t2, changes to L level at time point t3. Also assume that the control signals øA and øA of the address buffer 120 change from L to H level and H to L level, respectively, at time point t4, after which the latch is released and the input address changes again from L to H level at time point t5. Then, the waveform of signal N1 assumes a form of a thin pulse at low level. When a pulse with a insufficient pulse width like this is inputted to the prior art signal transition detection circuit, the pulse width of the detection signal (ATD signal) is thin and insufficient as compared with a normal pulse, often leading to the problem of an operating error caused in the other circuits controlled by the ATD signal. This problem can be solved by extension of the pulse width or waveform shaping at the sacrifice of a complicated circuit configuration or a complicated timing adjustment.

Also, the signal transition detection circuit connected to an input address of a semiconductor memory as described above can read the data with address transition, and therefore is used with a static column mode or the like. FIGS. 24 and 25 show a method of reading memory cell data in static column mode of a DRAM 140 as an example. FIG. 24 shows a configuration including a memory cell 141, a row address decoder 142, a column address decoder 143, a sense amplifier 144, and a second sense amplifier 145 for selecting the memory cell 141. FIG. 25 shows a timing chart for the static column mode.

Then a row address is inputted with RAS (Row Address Strobe) and a row address RiRjRk is inputted to a row address decoder 142, a selected word line W1 rises. The data in the memory cell 141 connected to a word line W1 is read on the bit line for each column. After that, the bit line data are sensed (when SE signal is of L level, and RSTOL signal is of H level).

With the transition of the input address and the column address CiCj input, the address transition detection circuit detects the address transition and generates an ATD signal. The ATD signal is combined with the column address CiCj to raise the selected CST1 to H level. The bit lines (BB1, B1#) and data lines (data, data) are connected so that data are read on the data lines (data, data#). Then, an MAE signal is outputted in response to the ATD signal (pulse), and the second sense amplifier 145 is activated thereby to read data on the Rdata line.

The ATD circuit 130, however, cannot produce an output pulse signal (detection signal) of sufficient width in response to an input pulse of a width shorter than the delay through three inverter stages. As shown in FIGS. 26 and 27, for example, the signal OUT for the input pulse with a delay width t of an amount of one inverter stage has a delay width t of an amount equivalent to only one inverter stage and is therefore insufficient in pulse width. The insufficient pulse width of the ATD circuit 130 causes an operating error of the circuit controlled by the ATD circuit 130. In the circuit configuration shown in FIG. 24, for example, CST1 has an insufficient pulse width, leading to an insufficient connection between the bit line and the data line. Also, the pulse width of the MAE becomes insufficient, thereby leading to an operating error of the second sense amplifier 145.

Conventional ATD circuits are disclosed in Japanese Unexamined Patent Publication JP-A 60-187993 (1985) and Japanese Unexamined Patent Publication JP-A 4-74381 (1992) in addition to those described above. These prior art circuits, which are intended to prevent an operating error caused by noises and not to detect a transition for an input signal having a short pulse width, are unable to detect a transition of a signal which changes at high speed.

SUMMARY OF THE INVENTION

Hence the invention is directed to solving these problems of the prior art, and an object of the invention is to provide a signal transition detection circuit capable of causing the generation of a signal having a sufficient pulse width as compared with a thin pulse input without extension of the pulse width or shaping of waveform in the preceding circuit stage.

According to the invention, there is provided a signal transition detection circuit, in which four types of signals are generated in such a way that delay times of second to fourth signals behind a first signal increases in the order of the second to fourth signal. The transition of an input signal from a first logic level to a second logic level is detected by a first detection circuit as a first predetermined combination of logic levels of the first and third signals. The transition of the input signal from the second logic level to the first logic level is detected by a second detection circuit as a second predetermined combination of logic levels of the second and fourth signals.

A third detection circuit detects a third combination having different logic levels of the first and third signals from those of the first combination. In the third combination, therefore, like in the second combination, the transition of the input signal from the second logic level to the first logic level is detected. The change in the first and third signals runs ahead of the change in the second and fourth signals. The third detection circuit, therefore, can detect in advance of the second detection circuit that the input signal changes from the second logic level to the first logic level.

A fourth detection circuit detects a fourth combination of logic levels of the second and fourth signals different from the second combination. In the fourth combination, therefore, like in the first combination, the transition of the input signal from the first logic level to the second logic level is detected. The change in the second and fourth signals is delayed behind the change in the first and third input signals. The fourth detection circuit, therefore, can detect later than the first detection circuit that the input signal changes from the first logic level to the second logic level.

An output circuit produces an output of a predetermined logic level only when the first to fourth detection circuits detect at least one of the first to fourth combinations described above. The transition of the logic level of the input signal is detected with a time lag between the first and fourth detection circuits and between the second and third detection circuits. In this way, a signal of sufficient pulse width can be generated as an output in response to an input signal of thin pulse width. Consequently, the transition of the logic level of an input signal can be detected accurately without pulse width extension or shaping of waveform in the preceding input stages.

A signal transition detection circuit according to the invention comprises a first AND gate and a first OR gate supplied with signal a1 and signal c1 delayed behind signal a1 by an amount of three inverter stages, respectively, a second AND gate and a second OR gate supplied with signal b1 delayed behind signal a1 by an amount of one inverter stage and signal d1 delayed behind signal b1 by an amount of three inverter stages, respectively, a NOR gate supplied with the output of the first AND gate and the output of the second AND gate, a NAND gate supplied with the output of the first OR gate and the second OR gate, a coupling transistor supplied with the output of the NAND gate, and an inverter having an input gate connected with the output of the coupling transistor and the output of the NOR gate through a pull-up node, whereby the above-mentioned object is achieved.

A signal transition detection circuit of the invention can be configured as follows. That is, a pull-up node of a pull-up transistor of the second conduction type of P type is connected to the input terminal of an inverter. Two elements each of which is composed of a set of two series-connected transistors of the first conduction type of N-type are connected in parallel with each other between the pull-up node and a GND providing the second side of a power supply. These elements are referred to as a first set of transistors and a second set of transistors, respectively. In the first set of transistors, the input signal c1 to the N-type transistor on the GND side is delayed behind the input signal a1 of the N-type transistor on pull-up node side by an amount of three inverter stages. In the second set of transistors, the input signal b1 of the N-type transistor on pull-up node side is delayed behind the input signal a1 of the N-type transistor on pull-up node side of the first set of transistors by an amount of one inverter stage. Also, the input signal d1 of the N-type transistor on the GND side is delayed behind the input signal a1 of the N-type transistor on pull-up node side by an amount of three inverter stages. Further, a coupling transistor with the output thereof connected to the input of the inverter has the input terminal thereof connected to the pull-down node of the pull-down transistor. Third and fourth sets of two series-connected P-type transistors are connected in parallel with each other between the pull-down node and the power supply line VDD on the first side of the power supply. In the third set of transistors, the input signal a1 of the P-type transistor on the power supply line VDD side is identical to the input signal a1 of the transistor on pull-up node side in the first set of transistors. In the third set of transistors, the input signal c1 of the P-type transistor on pull-down node side is delayed from the input signal a1 by an amount of three inverter stages. In the fourth set of transistors, the input signal b1 of the P-type transistor on the power supply line VDD side is delayed behind the input signal a1 on the first side of the power supply in the third set of transistors by an mount of one inverter stage. In the fourth set of transistors, the input signal d1 of the transistor on pull-down node side is delayed behind the input signal b1 of the P-type transistor on the power supply line VDD side by an amount of three inverter stages.

A signal transition detection circuit according to the invention comprises a first exclusive-OR gate supplied with an input signal a2 and an input signal c2 delayed behind signal a1 by an amount of two inverter stages, a second exclusive-OR gate supplied with signal c2 delayed behind signal a1 by an amount of one inverter stage and signal d2 delayed behind signal a2 by an amount of three inverter stages, an AND gate supplied with the output of the first exclusive-OR gate and the output of the second exclusive-OR gate, and an inverter supplied with the output of the AND gate through a pull-up node, whereby the above-mentioned object is achieved.

A signal transition detection circuit according to the invention may be configured in the following way. Specifically, the circuit comprises four elements each of which is composed of a transistor of the second conduction type of P-type and a transistor of the first conduction type of N-type which are connected in series. The N-type transistor of each element is connected to the GND on the second side of a power supply. The P-type transistor of each set is connected to a pull-up transistor and an inverter for transmitting an output. The input signal c2 of the N-type transistor in the first set is delayed behind the input signal a2 of the P-type transistor in the first set by an amount of two inverter stages. The input signal a1 of the N-type transistor of the second set is identical to the input signal a2 of the P-type transistor of the first set. The input signal c2 of the P-type transistor of the second set is identical to the input signal c2 of the N-type transistor of the first set and is delayed behind the input signal a2 by an amount of two inverter stages. The input signal b2 of the P-type transistor of the third set is the input signal a2 of the P-type transistor of the first set inverted by an inverter. The input signal d2 of the N-type transistor of the third set is delayed behind the input signal b2 by an amount of two inverter stages. The input signal b2 of the N-type transistor of the fourth set is identical to the input signal b2 of the P-type transistor of the third set. The input signal d2 of the P-type transistor of the fourth set is identical to the input signal d2 of the N-type transistor of the third set and is delayed behind the input signal b2 by an amount of two inverter stages.

Now, the operation of the invention will be explained.

A signal transition detection circuit according to the invention is such that the temporal relation between signals a1, b1, c1 and d1 is regulated in such a manner as to draw the potential of the pull-up node to L level twice thereby to lengthen the output pulse width.

A signal transition detection circuit according to the invention is also such that in the case where signals a1 and c2 are not coincident with each other or signals b2 and d2 are not coincident with each other, then the potential of the pull-up node is drawn to L level. The output pulse width can thus be enlarged by regulating the temporal relation between the four signals a2, b2, c2 and d2.

In the case where a signal transition detection circuit according to the invention described above is used as an ATD circuit, an ATD signal having a large pulse width as compared with that produced by the prior art circuits can be generated even when the input address transition produces a thin pulse.

In a signal transition detection circuit according to the invention, the temporal relation between signals a1, b1, c1 and d1 is regulated to draw the potential of the pull-up node to L level twice, whereby the output pulse width can be enlarged without any extension of pulse width or shaping of waveform in preceding stages.

Also, a signal transition detection circuit according to the invention is such that in the case where signals a2 and c2 are not coincident with each other or signals b2 and d2 are not coincident with each other, the potential of the pull-up node is drawn to L level. The output pulse width thus can be enlarged without extension of the pulse width or shaping of waveform in preceding stages by regulating the temporal relation between the four signals a2, b2, c2 and d2.

A more stable ATD signal than in the prior art circuits can be generated by using a signal transition detection circuit according to the invention as an ATD circuit. The operation margin of the circuits controlled by the ATD signal can thus be increased.

BRIEF DESCRIPTION OF THE DRAWINGS

Other and further objects, features, and advantages of the invention will be more explicit from the following detailed description taken with reference to the drawings wherein:

FIG. 2 is a timing chart for the signal transition detection circuit of FIG. 1;

FIGS. 3A to 3C are diagrams showing the output pulse width of a pulse input signal (L level pulse) of the signal transition detection circuit of FIG. 1 as compared with the output pulse width in the case of a prior art signal transition detection circuit;

FIG. 5 is a diagram showing a signal transition detection circuit and an electrical circuit representing the temporal relation between a plurality of signals in the signal transition detection circuit of a second embodiment of the invention;

FIG. 6 is a timing chart for the signal transition detection circuit of FIG. 5;

FIG. 18 is a diagram showing an equivalent circuit including the signal transition detection circuit of a second embodiment of FIG. 5;

FIG. 19 is a diagram showing a prior art signal transition detection circuit and an electrical circuit showing a temporal relation between a plurality of signals in the signal transition detection circuit;

DETAILED DESCRIPTION OF THE PREFERRED EMBODIMENTS

Figure 1:
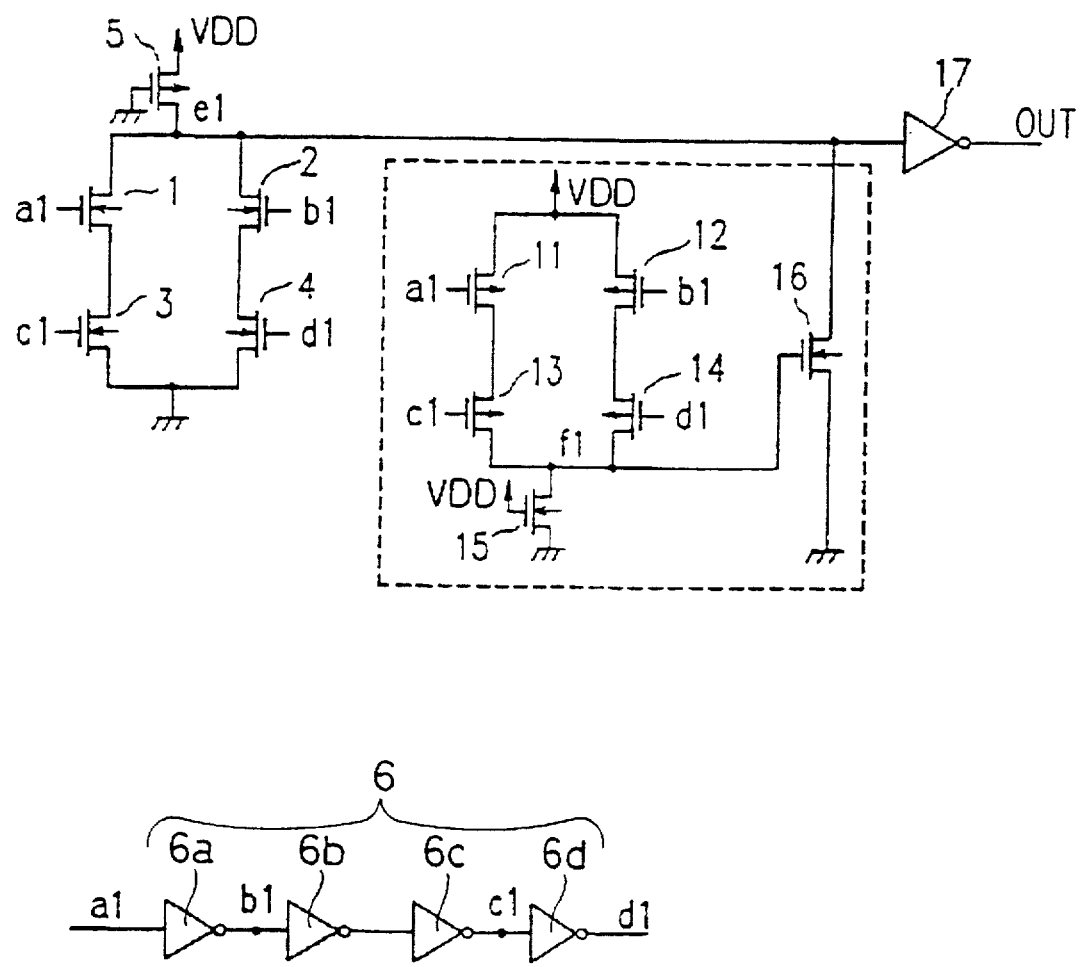
FIG. 1 is a diagram showing a signal transition detection circuit and an electrical circuit representing the temporal relation between a plurality of signals in a signal transition detection circuit of a first embodiment of the invention.

Now referring to the drawings, preferred embodiments of the invention are described below.

(First Embodiment)

FIG. 1 is a diagram showing a configuration of a signal transition detection circuit of an embodiment of the invention, and a diagram showing a temporal relation between a plurality of signals in a signal transition detection circuit. FIG. 2 is a timing chart for the signal transition detection circuit.

The signal transition detection circuit according to this embodiment, as shown in FIG. 1, comprises a first set of series-connected N-MOSFETs 1, 3 and a second set of series-connected N-MOSFETs 2, 4, which are connected in parallel with each other between a pull-up node e1 on the drain electrode side of a pull-up P-MOSFET 5 and a GND. The gates of the N-MOSFETs 1 to 4 are supplied with signals a1, b1, c1, d1 from a delay circuit 6. The gate signal c1 of the N-MOSFET 3 of the first set with the source electrode thereof connected to the GND is delayed behind the gate signal a1 of the N-MOSFET 1 with the drain electrode thereof connected to the pull-up node e1 by an amount of three inverter stages 6a, 6b, 6c.

In the second set of N-MOSFETs, the gate signal b1 of the N-MOSFET 2 with the drain electrode thereof connected to the pull-up node e1 is delayed behind the gate signal a1 of the N-MOSFET 1 with the drain electrode thereof connected to the pull-up node e1 of the first set by an amount of one inverter stage 6a. Also, the gate signal d1 of the N-MOSFET 4 with the source electrode thereof connected to the GND is delayed behind the gate signal b1 of the N-MOSFET 2 with the drain electrode thereof connected to the pull-up node e1 by an amount of three inverter stages 6b, 6c, 6d.

The signal transition detection circuit further comprises a third set of series-connected P-MOSFETs 11, 13 connected in parallel with a fourth set of series-connected P-MOSFETs 12, 14 inserted in parallel with each other between the power supply line VDD and a pull-down node f1 on the drain electrode side of the N-MOSFET 15. The gate signal a1 of the P-MOSFET 11 of the third set with the source electrode thereof connected to the power supply VDD is identical with the gate signal a1 of the N-MOSFET 1 with the drain electrode thereof connected to the pull-up node e1 described above. The gate signal c1 of the P-MOSFET 13 with the drain electrode thereof connected to the pull-down node f1 is delayed behind the gate signal a1 by an amount of three inverter stages.

In the fourth set, the gate signal b1 of the P-MOSFET 12 with the source electrode thereof connected to the power supply line VDD is delayed behind the gate signal a1 of the P-MOSFET 11 with the source electrode thereof connected to the power supply line VDD of the first set by an amount of one inverter stage. Also, the gate signal d1 of the P-MOSFET 14 with the drain electrode thereof connected to the pull-down node f1 is delayed behind the gate signal b1 of the P-MOSFET 12 with the source electrode thereof connected to the power supply line VDD by an amount of three inverter stages.

The pull-down node f1 is connected to the gate electrode of a N-MOSFET 16 with the drain electrode thereof connected to the pull-up node e1 and the source electrode thereof connected to the GND. Also, the pull-up node e1 is connected to the input gate of an inverter 17, which in turn is adapted to generate a pulse signal to the inverter OUT upon detection of a transition of the signal inputted to the transistors 1 to 4, and 11 to 14.

In the signal transition detection circuit configured in the way mentioned above according to this embodiment, as shown in FIG. 2, when a transition signal changing from L through H to L level is inputted as a gate signal a1, signal b1 is delayed behind signal a1 by an amount of one inverter stage, and then changes from H through L to H level. Also, signal c1 is delayed behind signal a1 by an amount of three inverter stages, and then changes from H through L to H level. Signal d1 is delayed behind signal a1 by an amount of four inverter stages, and then changes from L through H to L level. The pull-up node e1 is charged normally to H level from the power supply line VDD through the pull-up P-MOSFET 5.

Figure 22:
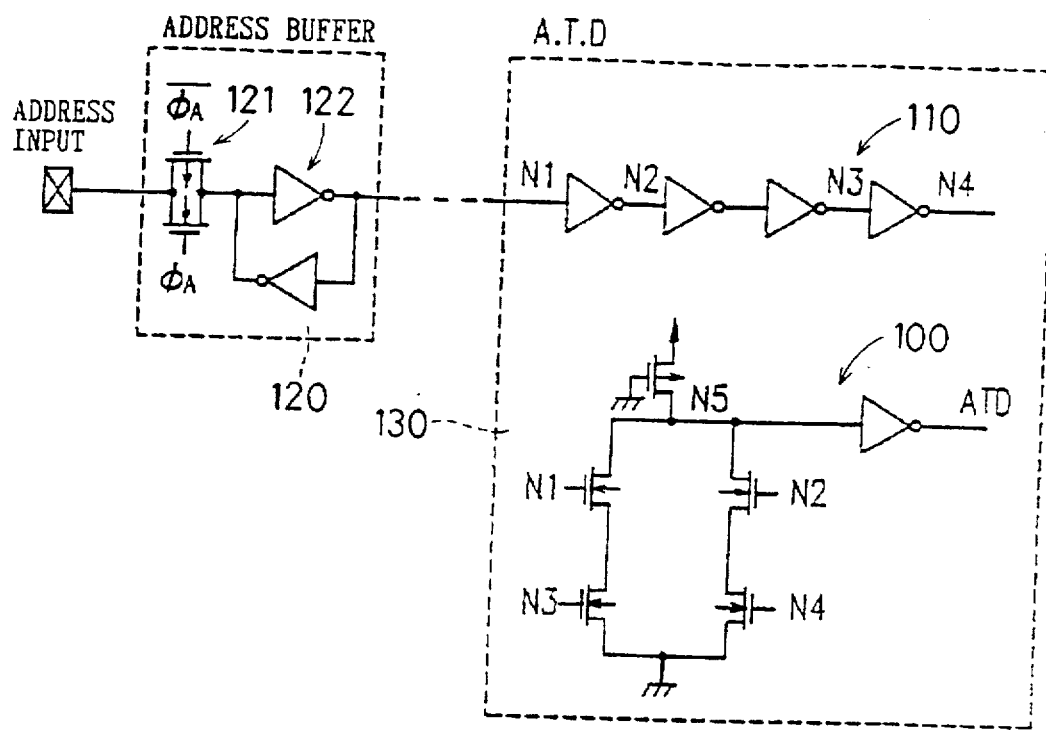
FIG. 22 is a diagram showing an electrical circuit configuration illustrating an application of a prior art signal transition detection circuit.
Figure 23:
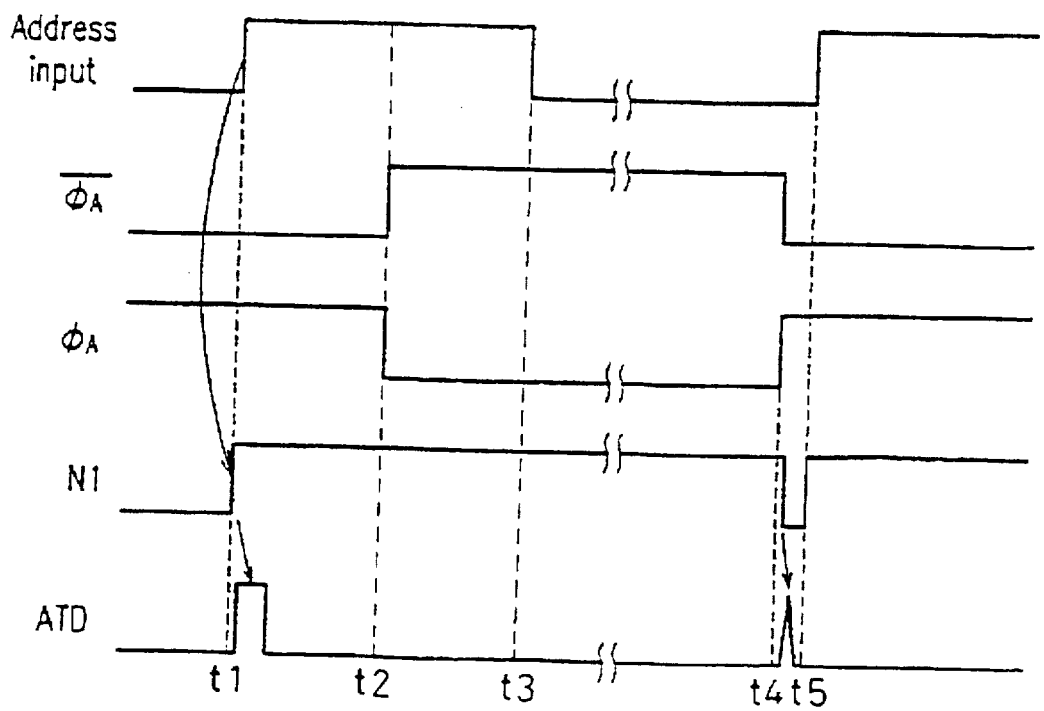
FIG. 23 is a timing chart for the application of FIG. 22.
Figure 24:
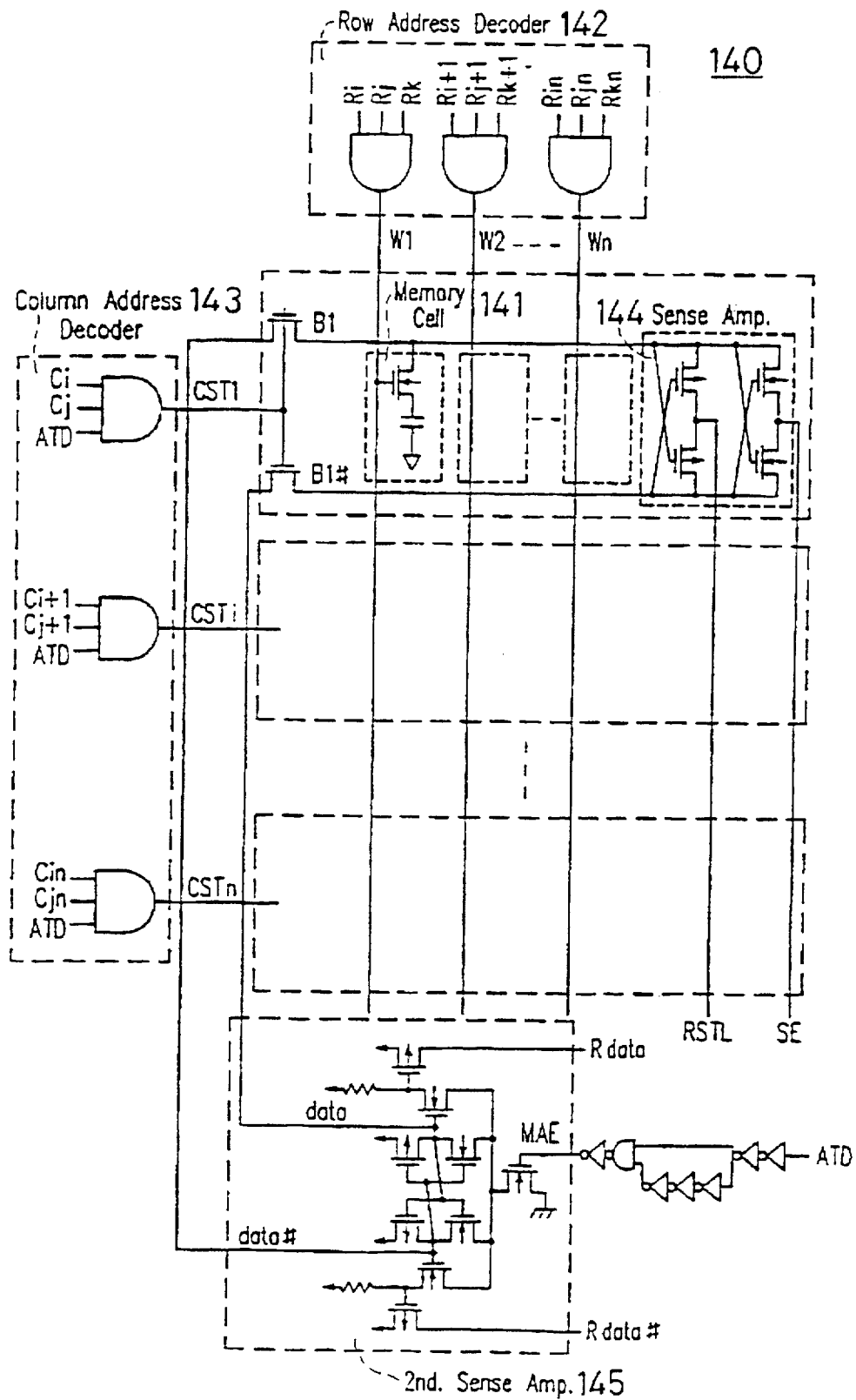
FIG. 24 is a block diagram showing a circuit configuration of a DRAM used for a prior art signal transition detection circuit.
Figure 25:
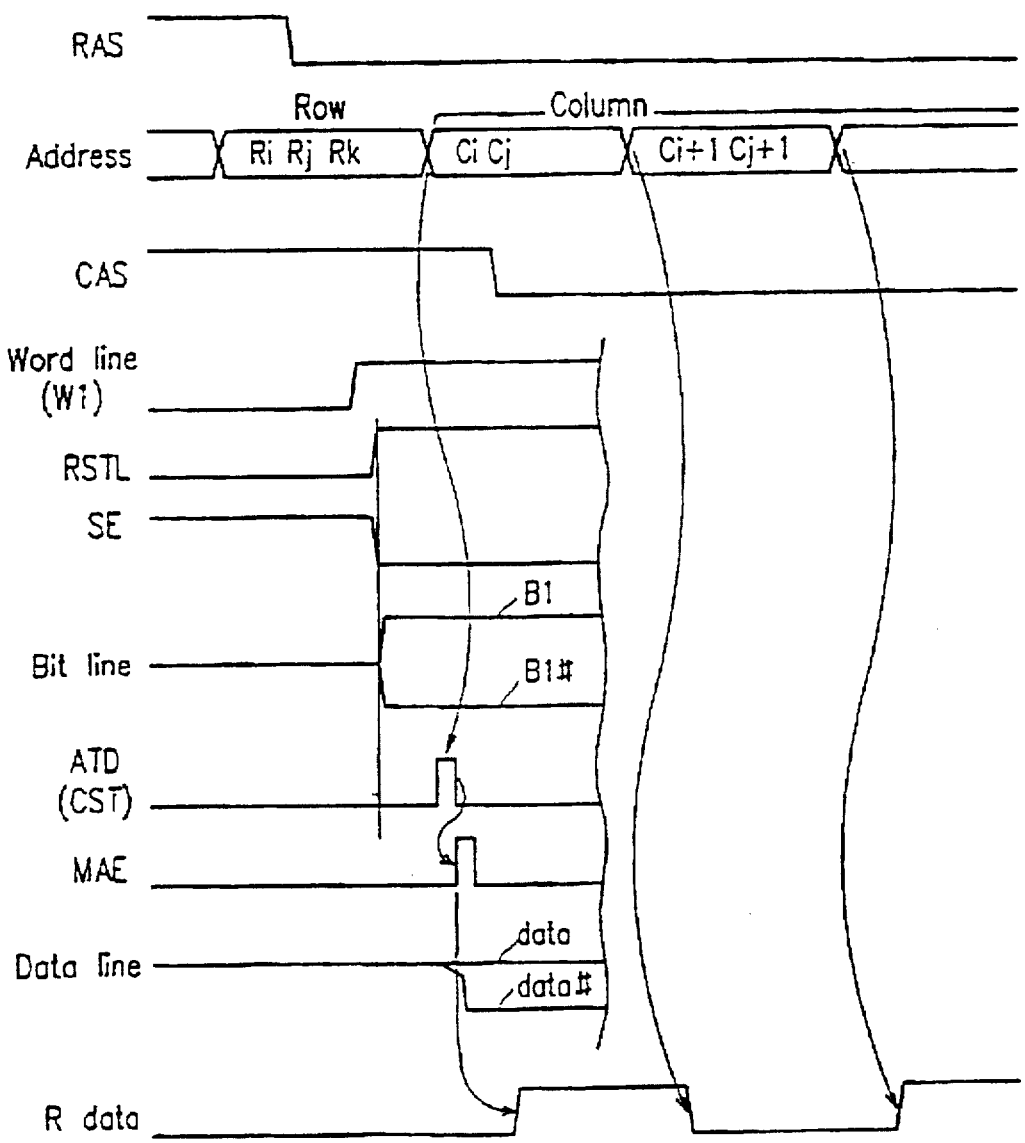
FIG. 25 is a timing chart for a static column mode in the circuit configuration of FIG. 24.
Figure 26:
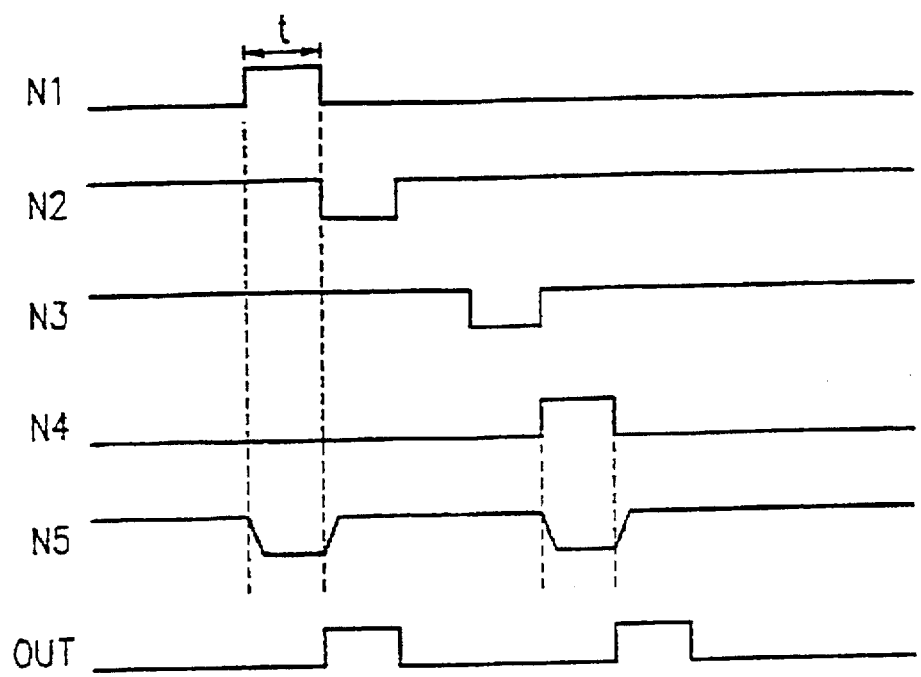
FIG. 26 is still another timing chart for a prior art signal transition detection circuit.
Figure 27:
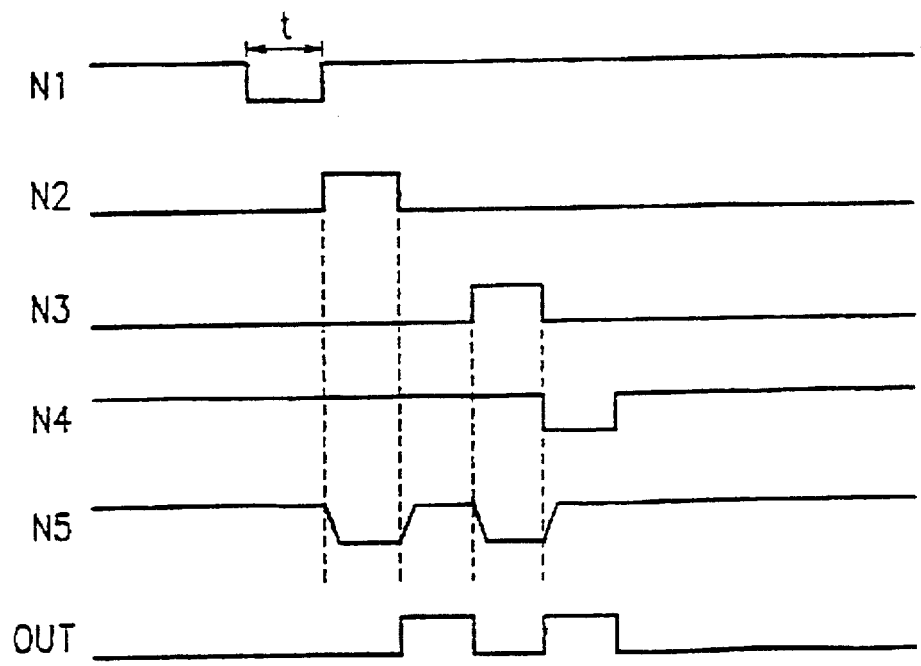
FIG. 27 is a yet another timing chart for a prior art signal transition detection circuit.

Herein, when signal a1 changes from L to H level and signals a1, c1 are both of H level, the N-MOSFETs 1, 3 which are connected in series between the pull-up node e1 and the GND and whose gates are supplied with signals a1, c1, respectively, are turned on. The pull-up node e1 is discharged and the level thereof is drawn to L level. On the other hand, when signals b1, d1 are both of H level, the N-MOSFETs 2, 4 which are connected in series between the pull-up node e1 and the GND and whose gate electrodes are with signals b1, d1, respectively, are turned on, and therefore the level of the pull-up node e1 is drawn to L level. This operation is identical to that of the conventional ATD circuit 130 shown in FIG. 22.

In this circuit, however, when signals a1 and c1 or signals b1 and d1 are both of L level, the pull-down node f1 is supplied with charge by the P-type MOSFETs 11, 13 which are connected in series between the power supply line VDD and the pull-down node f1 and whose gates are supplied with signals a1, c1, respectively, and the P-MOSFETs 12, 14 which are connected between the power supply line VDD and the pull-down node f1 and whose gates are supplied with signals b1, d1, respectively. The pull-down node f1 is adapted to be normally discharged through the N-MOSFET 15 to assume L level on the GND side.

As described above, when signal a1 changes from L to H level, signals a1, c1 both assume H level, the N-MOSFETs 1, 3 turn on and the pull-up node e1 is drawn to L level. With subsequent delay of one inverter stage, signals b1, d1 are both reduced to L level, the P-MOSFETs 12, 14 turn on, and the pull-down note f1 increases in potential. As a result, the N-MOSFET 16 with the potential of the pull-down node f1 applied to the gate electrode thereof turns on, so that the pull-up node e1 is drawn again to L level from the state of dashed line to the state of solid line.

When signal a1 changes from H to L level, both signals b1, d1 become H level, the N-MOSFETs 2, 4 are turned on, and the pull-up node e1 is drawn to L level. Before the delay of one inverter stage, signals a1, c1 are both reduced to L level, the P-MOSFETs 11, 13 turn on, and the pull-down node f1 increases in potential. As a result, the N-MOSFET 15 with the potential of the pull-down node f1 applied to the gate electrode thereof is turned on, and the pull-up node e1 is drawn to L level transferring from the state of dashed line to the state of solid line.

As described above, the potential of the pull-up node e1 is drawn twice by the N-MOSFETs and the P-MOSFETs at different times, and therefore the pulse width of the output signal (OUT) is increased as compared with that of the prior art circuit. Even in the case where the input signal is applied in the form of a thin pulse, an ATD signal with a pulse width larger than in the prior art circuit is generated.

FIGS. 3A through 3C and 4A through 4C are diagrams for showing the output pulse width of the pulse input signal to the circuit of the invention in comparison with the output pulse width for the prior art circuit.

FIGS. 3A through 3C show results of L level pulse input. The pulse width is changed in the range of 0.1 ns to 0.25 ns at time intervals of 0.05 ns. (1) represents the case in which the pulse width is 0.1 ns, (2) the case in which the pulse width is 0.15 ns, (3) the case in which the pulse width is 0.2 ns, and (4) the case in which the pulse width is 0.25 ns. As seen from this diagram, the output pulse width is insufficient in all cases for the prior art circuit, while a sufficient pulse width is obtained in the circuit for the input pulse of 0.2 ns or more according to the invention.

Figure 4A:
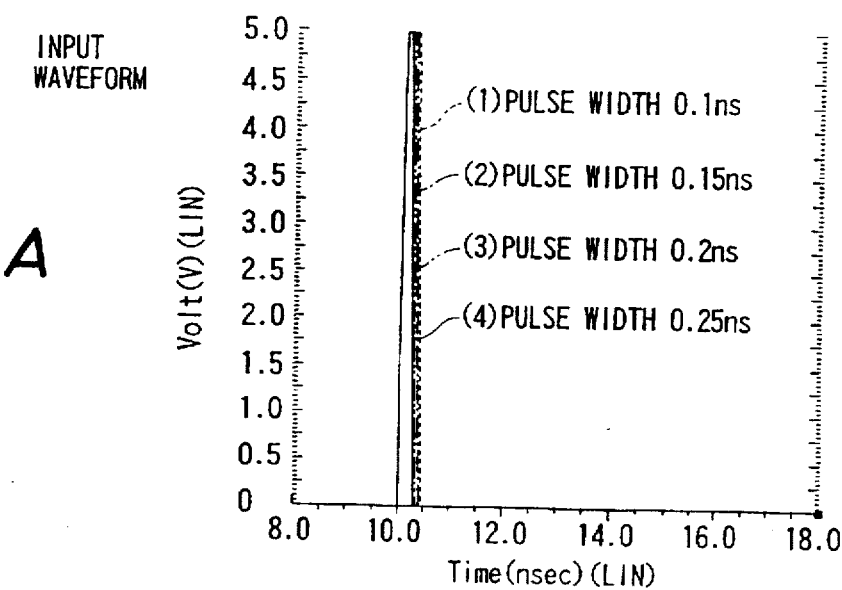
FIGS. 4A to 4C are diagrams showing the output pulse width of a pulse input signal (H level pulse) of the signal transition detection circuit as compared with the output pulse width in the case of the prior art signal transition detection circuit.
Figure 4B:
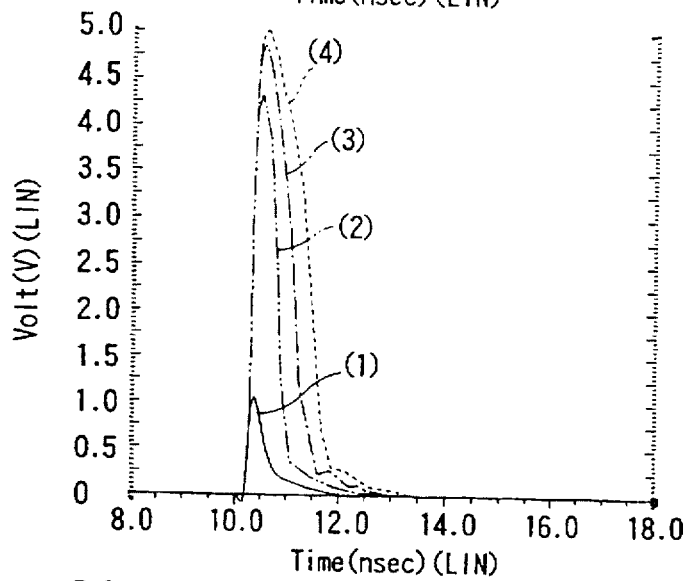
Figure 4C:
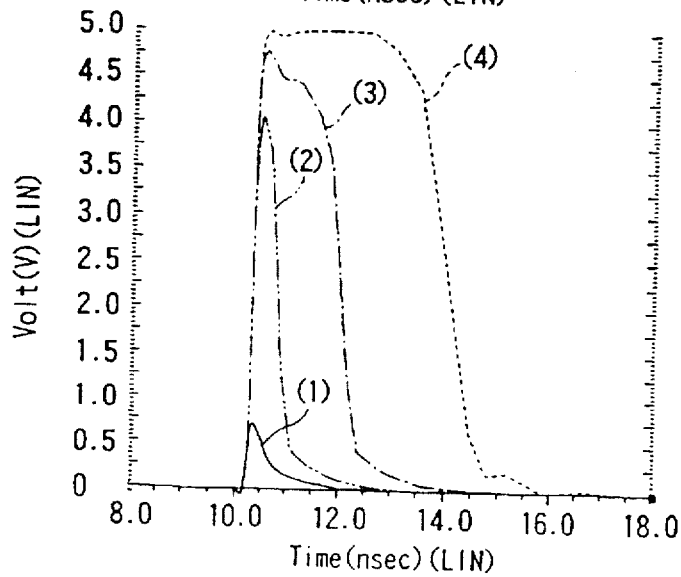

Results of H level pulse input are shown in FIGS. 4A through 4C, in which the pulse width is changed in the range of 0.1 ns to 0.25 ns at intervals of 0.05 ns. (1) represents the case in which the pulse width is 0.1 ns, (2) the case in which the pulse width is 0.15 ns, (3) the case in which the pulse width is 0.2 ns, and (4) the case in which the pulse width is 0.25 ns. As seen from this diagram, an output of a sufficient pulse width is produced for the input pulse of 0.2 ns or more in the circuit according to the invention, although all output pulse widths are insufficient in the prior art circuit.

In the case where a signal transition detection circuit according to the invention is used as an ATD circuit, therefore, it is possible to generate a detection signal having a pulse width of 1 ns or more against an input signal of 0.2 ns or more in pulse width. The deformation of the pulse waveform can thus be suppressed when the ATD signal is transmitted through an inverter chain or the like.

(Second Embodiment)

FIG. 5 shows a signal transition detection circuit according to the invention, in which a delay circuit 20 delays the signal through three stages of inverters 20a, 20b, 20c.

The signal transition detection circuit according to this embodiment comprises a first set including a P-MOSFET 21 and an N-MOSFET 22, a second set including a P-MOSFET 23 and an N-MOSFET 24, a third set including a P-MOSFET 25 and an N-MOSFET 26 and a fourth set including a P-MOSFET 27 and an N-MOSFET 28, the MOSFETs in each set being connected in series with each other through the drains thereof. Also, the four sources of the N-MOSFETs 22, 24, 25, 28 are all connected to the GND. The four sources of the P-MOSFETs 21, 23, 25, 27, on the other hand, are connected to a pull-up node e2 connected to the drain electrode of a P-MOSFET 29 intended for pull-up and the input of an inverter 30 for transmitting the output.

The gate signal c2 of the N-MOSFET 22 in the first set is delayed behind the gate signal a1 of the P-MOSFET 21 in the first set by an amount of two inverter stages.

The gate signal c2 of the P-MOSFET 23 in the second set is delayed behind the gate signal a2 of the N-MOSFET 24 in the second set by an amount of two inverter stages.

The gate signal b2 of the P-MOSFET 25 in the third set is the gate signal a2 of the P-MOSFET 21 in the first set inverted by the inverter. The gate signal d2 of the N-MOSFET 26 in the third set is delayed behind the gate signal b2 by an amount of two inverter stages.

The gate signal d2 of the P-MOSFET 27 in the fourth set is delayed behind the gate signal b2 of the N-MOSFET in the fourth set by an amount of two inverter stages. The output signal OUT of the inverter provides a detection signal.

In the signal transition detection circuit according to this embodiment configured as described above, a detection signal of a sufficient pulse width is generated even when the pulse delayed by one inverter stage (t) and changing from L through H to L level as shown in FIG. 6 is inputted as signal a2. In other words, when a pulse delayed by one inverter stage (t) and changing from L through H to L level is inputted and signal a2 changes from L through H to L level, signal b2 changes from H through L to H level. Then, signal c2 changes from L through H to L level, and further signal d2 changes from H through L to H level. In the process, if signal a2 is of H level and signal c2 is of L level, the N-MOSFET 24 with signal a2 applied to the gate electrode thereof is turned on, and so is the P-MOSFET 23 with signal c2 applied to the gate electrode thereof. The potential of the pull-up node e2 thus is drawn to the GND.

Then, in the case where signal b2 is of L level and signal d2 is of H level, the P-MOSFET 25 with signal b2 connected to the gate electrode thereof is turned on, and so is the N-MOSFET 26 with signal d2 applied to the gate electrode thereof. The potential of the pull-up node e2 thus is drawn to the GND. In the case where signal c2 is of H level and signal a2 is of L level, on the other hand, the N-MOSFET 22 with signal c2 applied to the gate electrode thereof is turned on, and so is the P-MOSFET 21 with signal a2 applied to the gate electrode thereof. The potential of the pull-up node e2 thus is drawn to the GND.

Further, in the case where signal d2 is of L level and signal b2 is of H level, the MOSFET 27 with signal d2 applied to the gate electrode thereof is turned on and so is the N-MOSFET 28 with signal b2 applied to the gate electrode thereof. The potential of the pull-up node e2 thus is drawn to the GND.

As long as the pull-up node e2 is drawn to the GND, the output signal OUT of the inverter 30 remains in H level state and a sufficient pulse width is outputted.

Figure 7:
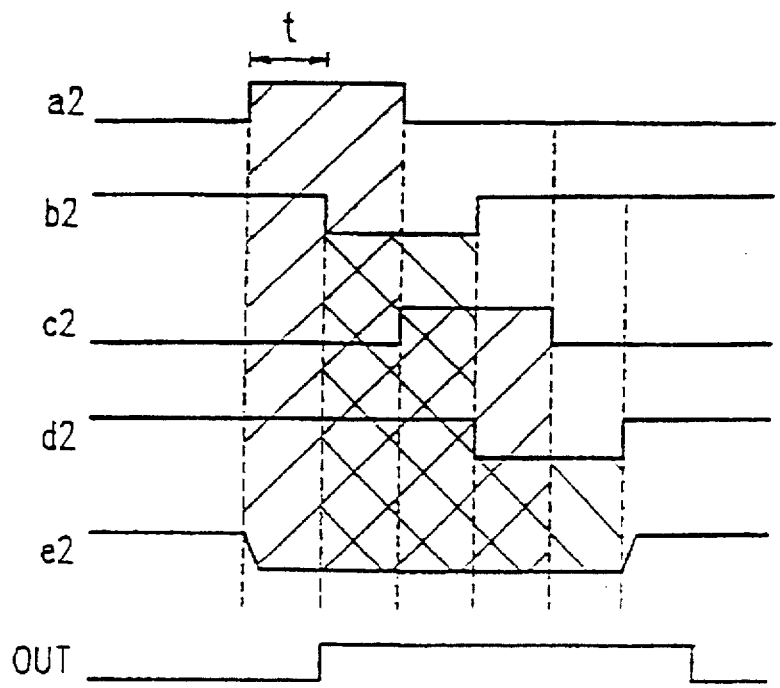
FIG. 7 is another timing chart for the signal transition detection circuit of FIG. 5.
Figure 8:
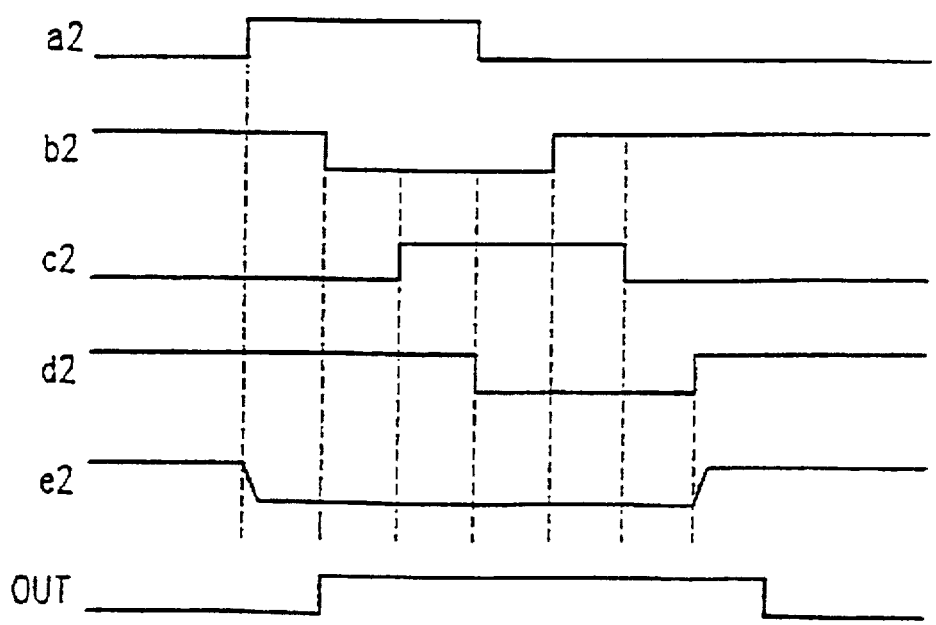
FIG. 8 is still another timing chart for the signal transition detection circuit of FIG. 5.
Figure 9:
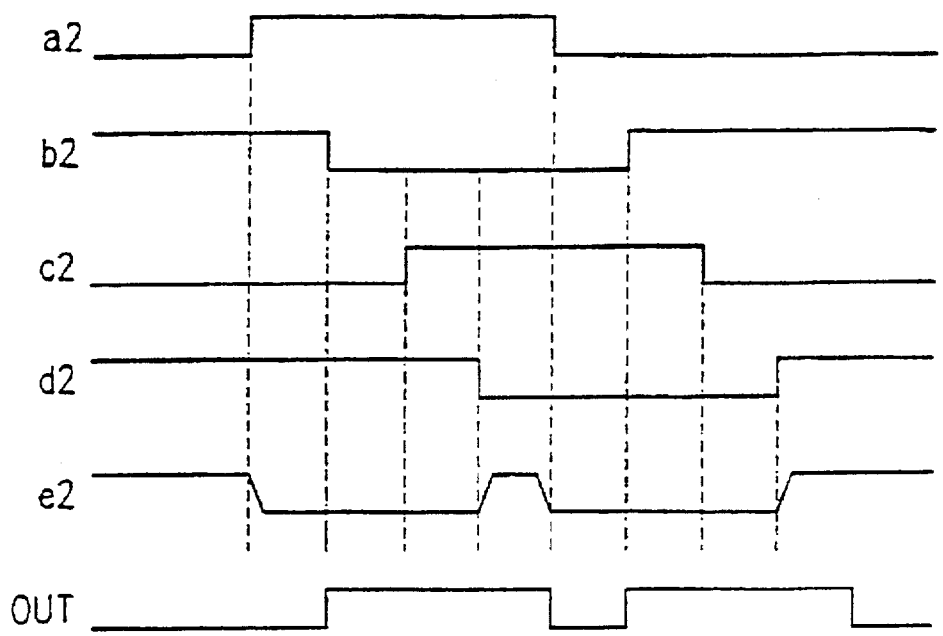
FIG. 9 is still another timing chart for the signal transition detection circuit of FIG. 5.
Figure 10:
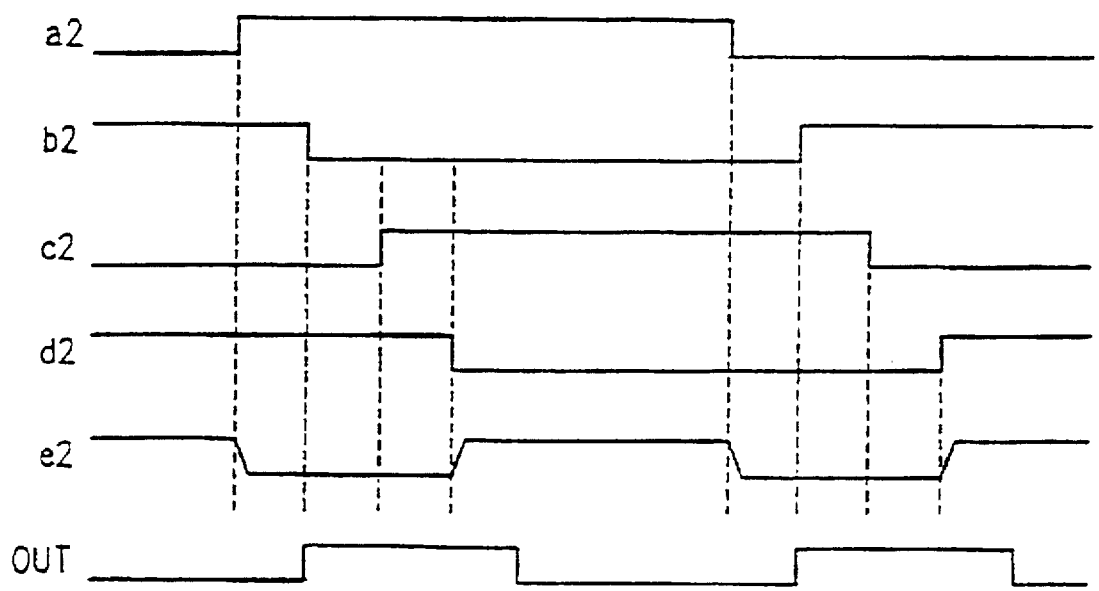
FIG. 10 is still another timing chart for the signal transition detection circuit of FIG. 5.

Also, the detection signal has a sufficient pulse width as shown in FIGS. 7 to 10 against various changes in the width of the input pulse changing from L through H to L level. FIG. 7 shows the case in which a pulse delayed by two inverter stages (2t) and changing from L through H to L level is inputted as signal a2. FIG. 8 shows the case in which a pulse delayed by three inverter stages (3t) and changing from L through H to L level is inputted as signal a2. Also, FIG. 9 shows the case in which a pulse delayed by four inverter stages (4t) and changing from L through H to L level is inputted as signal a2. FIG. 10 shows the case in which a pulse delayed by seven inverter stages (7t) and changing from L through H to L level is inputted as signal a2. In all of these cases, a detection signal with a sufficient pulse width is produced.

In the case of signal b2 having a comparatively short H level period of 2t or 3t as shown in the transitions therefor from L through H to L level in FIGS. 7 and 8, the transition detection circuit produces a pulse only once. More specifically, in the case where the signal to be detected in transition represents an address, an operating error would be caused if a memory cell corresponding to this comparatively short address (when H level period is 2t or 3t) is read. The output signal of the transition detection circuit behaves, therefore, as a signal for reading a memory cell corresponding to the next address. In other words, a signal for reading a memory cell corresponding to the address of the L level signal in the transition from H to L level is outputted only once as a pulse.

In the case of a signal shown in FIGS. 9 and 10 having a long H level period in the transition sequence L through H to L level for reading a predetermined memory cell, a pulse is generated for reading a memory cell corresponding to the address of the H level signal in the transition of H to L level, and a pulse is generated for reading a memory cell corresponding to the address of the L level signal in the transition of H to L level. As a result, the address transition sequence from L through H to L level generates two pulses.

Figure 11:
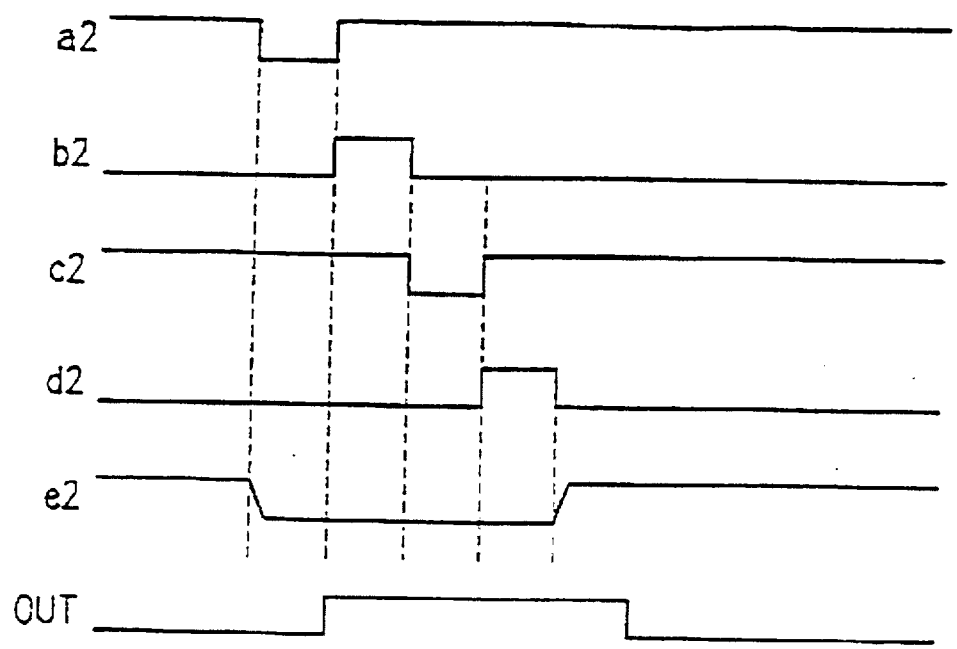
FIG. 11 is still another timing chart for the signal transition detection circuit of FIG. 5.
Figure 12:
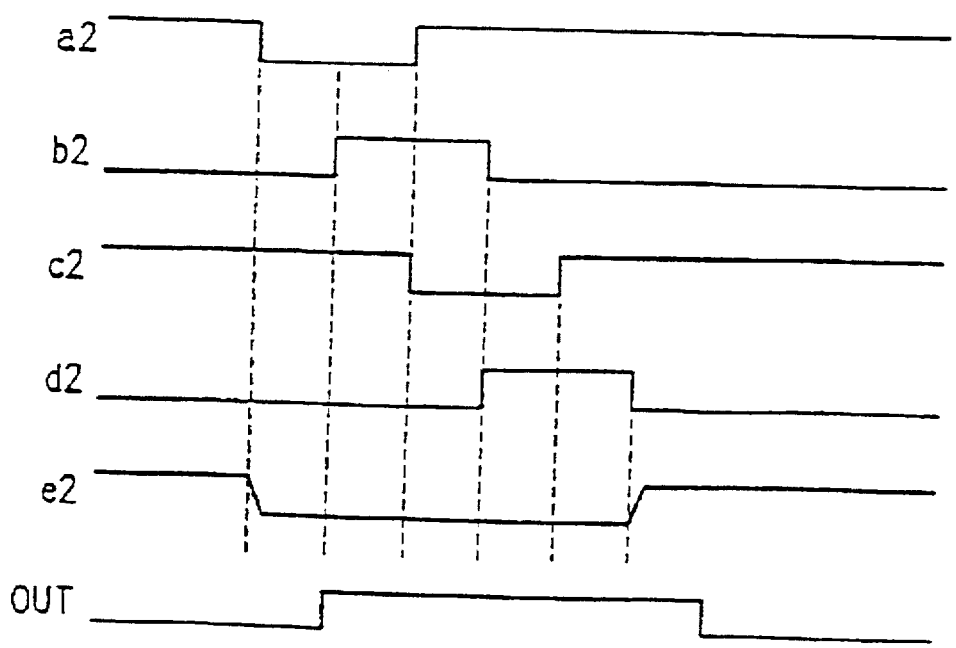
FIG. 12 is still another timing chart for the signal transition detection circuit of FIG. 5.
Figure 13:
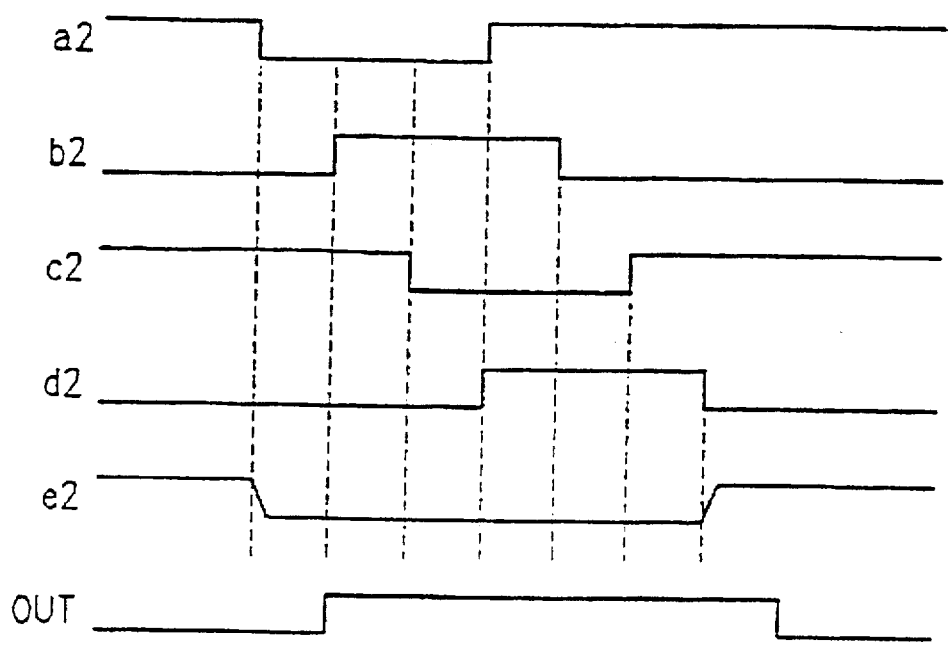
FIG. 13 is still another timing chart for the signal transition detection circuit of FIG. 5.
Figure 14:
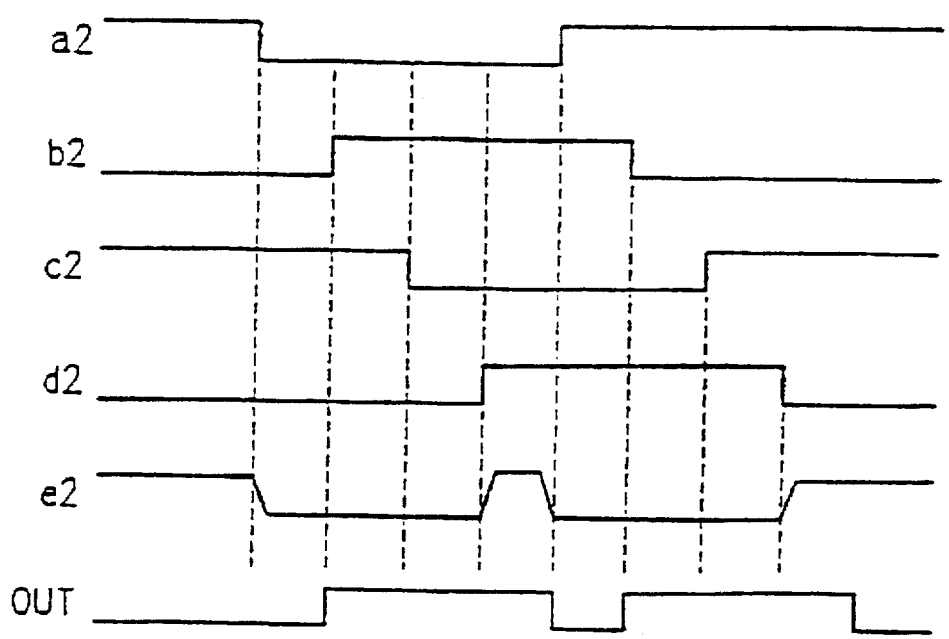
FIG. 14 is still another timing chart for the signal transition detection circuit of FIG. 5.
Figure 15:
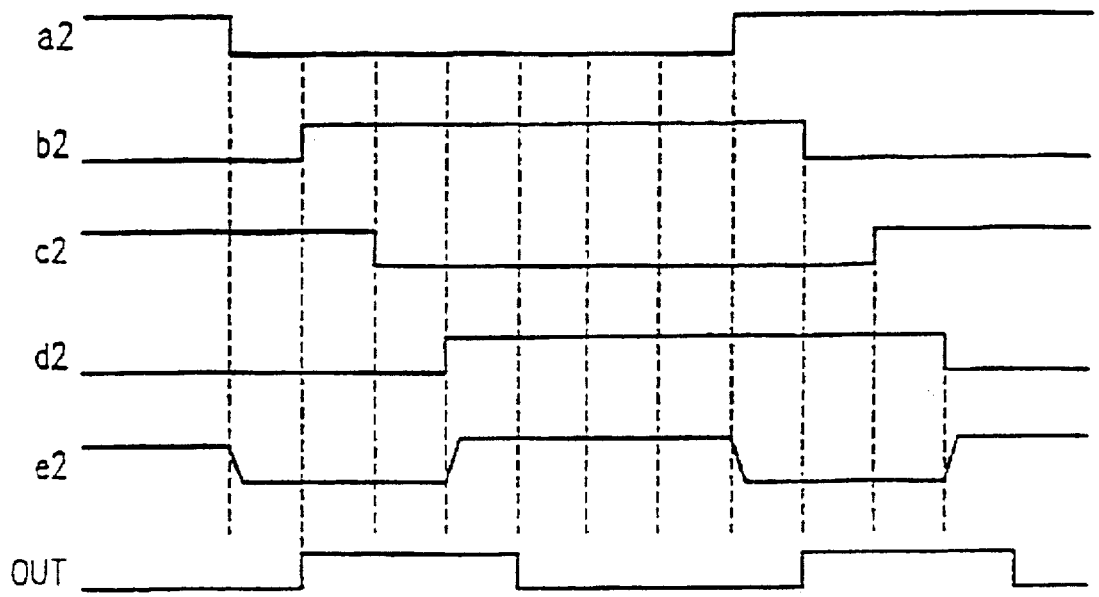
FIG. 15 is still another timing chart for the signal transition detection circuit of FIG. 5.

Also, a detection signal with a sufficient pulse width can be produced when a pulse delayed by one inverter stage and changing from H through L to H level shown in FIG. 11 is inputted as signal a2. In this case, the detection signal has a sufficient pulse width as shown in FIGS. 12 to 15 against various transition sequences H through L to H level with different input pulse widths. FIG. 12 shows the case in which a pulse delayed by two inverter stages (2t) and changing from H through L to H level is inputted as signal a2, and FIG. 13 shows the case in which a pulse delayed by three inverter stages (3t) and changing from H through L to H level is inputted as signal a2. Also, FIG. 14 shows the case in which a pulse delayed by four inverter stages (4t) and changing from H through L to H level is inputted as a2, and FIG. 15 the case in which a pulse delayed by seven inverter stages (7t) and changing from H through L to H level is inputted as signal a2. In all cases, a detection signal of sufficient pulse width is produced.

Even in the case where the address transition time is shorter than the delay of three inverter stages, therefore, an ATD signal with a sufficient pulse width can be produced by using this circuit as an ATD circuit.

Figure 16:
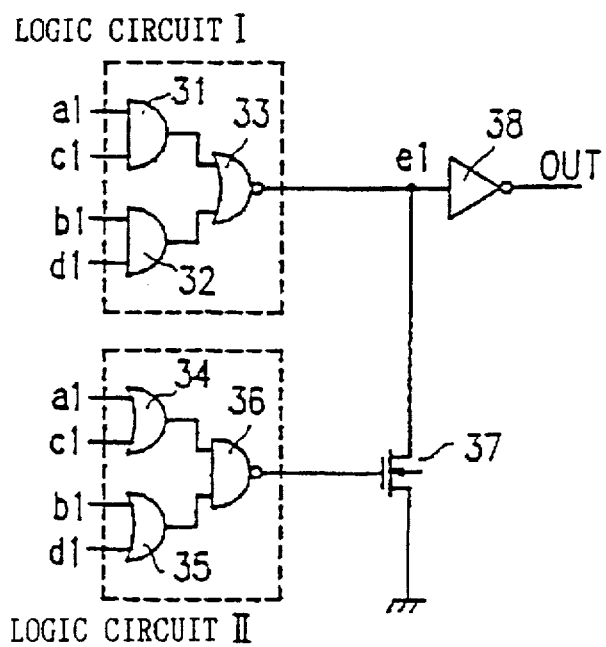
FIG. 16 is a diagram showing an equivalent circuit including the signal transition detection circuit of the first embodiment of FIG. 1.

The circuit configurations of the first and second embodiments were explained with reference to an example using transistors. The invention is not limited to these configurations, however, but is applicable to a configuration comprising any types of circuit elements as long as the logic circuit shown in FIG. 16 is obtained equivalently. This is also the case with the second embodiment, in which any types of circuit elements can be used as long as the logic circuit of FIG. 18 is obtained equivalently.

The circuit configuration shown in FIG. 16 comprises a first AND gate 31 and a first OR gate 34 supplied with signal a1 and signal c1 delayed behind signal a1 by an amount of three inverter stages, respectively, a second AND gate 32 and a second OR gate 35 supplied with signal b1 delayed behind signal a1 by an amount of one inverter stage and signal d1 delayed behind signal b1 by an amount of three inverter stages, respectively, a NOR gate 33 supplied with the output of the first AND gate 31 and the output of the second AND gate 32, a NAND gate 36 supplied with the output of the first OR gate 34 and the output of the second OR gate 35, an N-MOSFET 37 having a gate terminal connected to the output terminal of the NAND gate 36, and an inverter 38 having an input gate connected through the pull-up node e2 to the drain terminal of the N-MOSFET 37 and the output terminal of the NOR gate 33.

Figure 17:
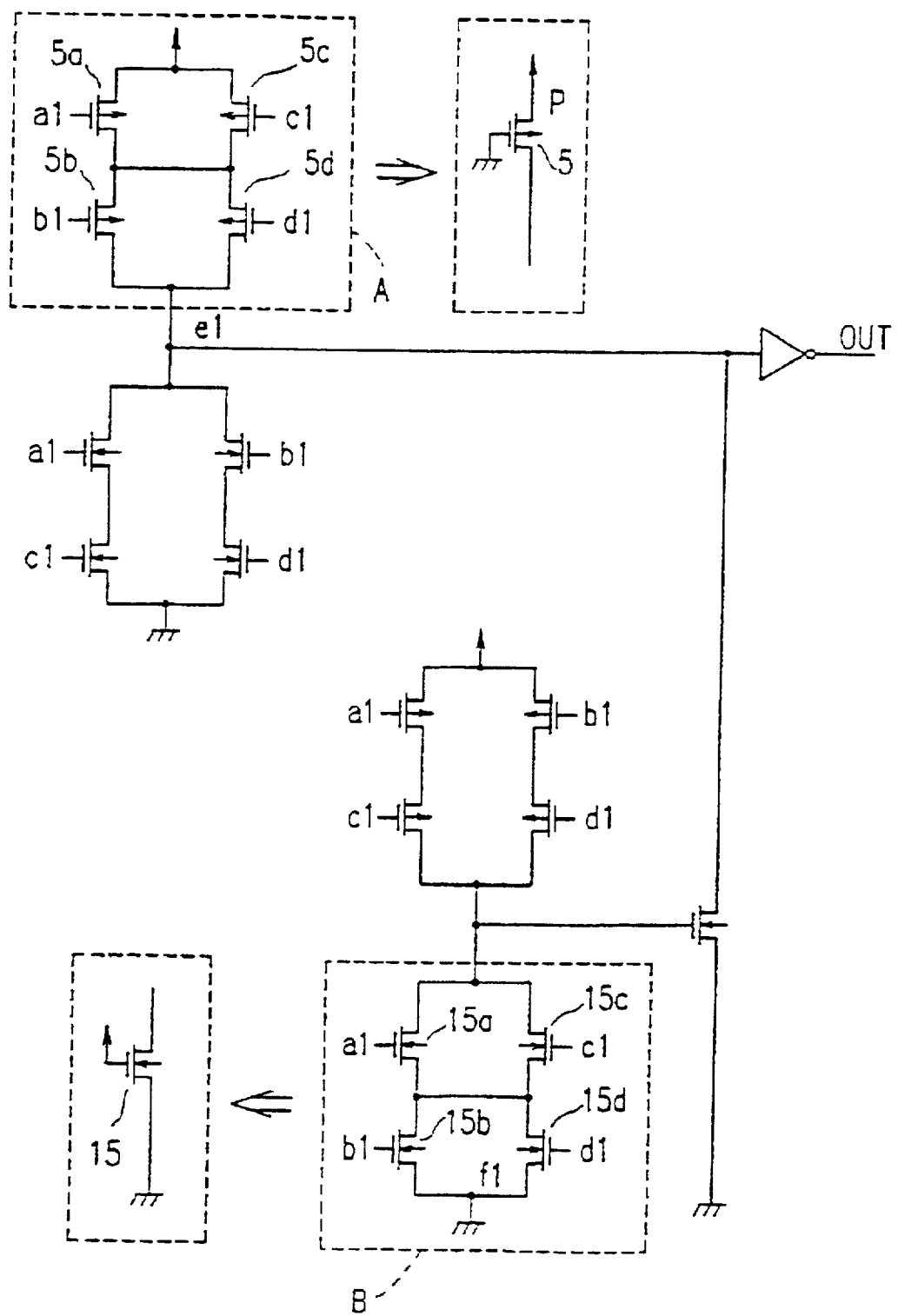
FIG. 17 is a diagram showing an electrical circuit configuration of another signal transition detection circuit of the first embodiment of FIG. 16.
Figure 20:
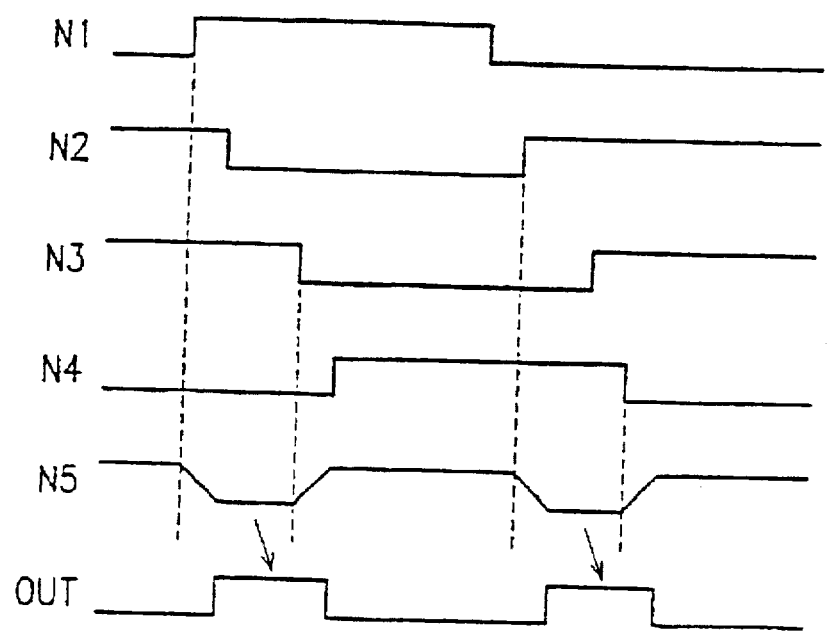
FIG. 20 is a timing chart for a prior art signal transition detection circuit.
Figure 21:
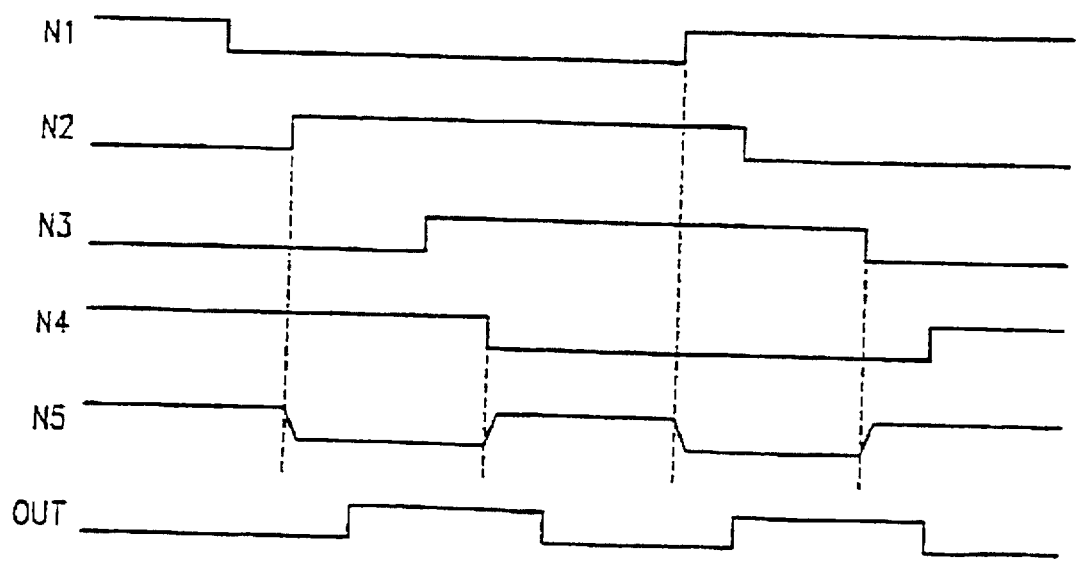
FIG. 21 is another timing chart for a prior art signal transition detection circuit.

In this case, a possible alternative configuration is shown in FIG. 17. The portion A of this circuit configuration includes P-MOSFETs 5a, 5b, 5c, 5d, and the portion B thereof includes N-MOSFETs 15a, 15b, 15c, 15d. Equivalently, however, the portion A is identical to the single pull-up P-MOSFET 5 shown in FIG. 1, and the portion B is identical to the single pull-down N-MOSFET 15 shown in FIG. 1. When the portion A or B is turned on, however, the resistance value thereof is reduced. In the configuration of FIG. 1, therefore, not only the number of transistors can be reduced, but also the pulse width can be further increased since the portions A and B in FIG. 17 are considered to constitute a load resistance in FIG. 1. In the signal waveforms of e1 and f1 in FIG. 2, for example, the introduction of a load resistance lengthens the transition state.

The circuit configuration of FIG. 18 described above includes a first exclusive-OR gate 41 supplied with signal a2 and signal c2 delayed behind signal a2 by an amount of two inverter stages, a second exclusive-OR gate 42 supplied with signal c2 delayed behind signal a2 by an amount of one inverter stage and signal d2 delayed behind signal a2 by an amount of three inverter stages, an AND gate 43 supplied with the output of the first exclusive-OR gate 41 and the output of the second exclusive-OR gate 42, and an inverter 44 supplied with the output of the AND gate 43 through the pull-up node e2.

The invention may be embodied in other specific forms without departing from the spirit or essential characteristics thereof. The present embodiments are therefore to be considered in all respects as illustrative and not restrictive, the scope of the invention being indicated by the appended claims rather than by the foregoing description and all changes which come within the meaning and the range of equivalency of the claims are therefore intended to be embraced therein.

Other types of transistors such as a junction FET or a bipolar transistor can be used instead of a MOSFET with effect. A similar function can also be realized when the N-type and P-type transistors are replaced with each other or when the polarities of the power source VDD and the GND are reversed. Further, the signal can be delayed by use of a means different from the inverter.

What is claimed is:

1. A signal transition detection circuit for generating first to fourth signals of four types in such a manner that delay times of the second to the fourth signals behind the first signal increases in the order from the second signal to the fourth signal, for detecting a first or a second predetermined combination of logic levels with respect to the first and the third signals or with respect to the second and the fourth signals, and for detecting transitions of a logic level of an input signal from one level to another level or from the other level to the one level, respectively, the signal transition detection circuit comprising:

a first detection circuit for detecting the first combination;

a second detection circuit for detecting the second combination;

a third detection circuit for detecting a third combination having different logic levels signals from those of the first combination with respect to the first and the third signals;

a fourth detection circuit for detecting a fourth combination having different logic levels from those of the second combination with respect to the second and the fourth signals; and an output circuit for outputting a predetermined logic level only when at least one of the first to the fourth combinations is detected by the first to the fourth detection circuits.

2. A signal transition detection circuit for generating first to fourth signals of four types in such a manner that delay times of the second to the fourth signals behind the first signal increases in the order from the second signal to the fourth signal, for detecting a first or a second predetermined combination of logic levels with respect to the first and the third signals or with respect to the second and the fourth signals, and for detecting transitions of a logic level of an input signal from one level to the other level or from another level to the one level, respectively, the signal transition detection circuit comprising:

a first detection circuit for detecting the first combination;

a second detection circuit for detecting the second combination;

a third detection circuit for detecting a third combination having different logic levels from those of the first combination with respect to the first and the third signals;

a fourth detection circuit for detecting a fourth combination having different logic levels from those of the second combination with respect to the second and the fourth signals; and an output circuit for outputting a predetermined logic, level only when at least one of the first to the fourth combinations is detected by the first to the fourth detection circuits;

wherein a signal b1 corresponding to the second signal, a signal c1 corresponding to the third signal, and a signal d1 corresponding to the fourth signal are delayed behind a signal a1 corresponding to the first signal by amounts corresponding to one inverter stage, three inverter stages and four inverter stages, respectively;

the first detection circuit is a first AND gate to which the signals a1 and c1 are inputted;

the second detection circuit is a second AND gate to which the signals b1 and d1 are inputted;

the third detection circuit is a first OR gate to which the signals a1 and c1 are inputted;

the fourth detection circuit is a second OR gate to which the signals b1 and d1 are inputted; and the output circuit includes:

a NOR gate to which an output of the first AND gate and an output of the second AND gate are inputted;

a NAND gate to which an output of the first OR gate and an output of the second OR gate are inputted;

a coupling transistor to which an output of the NAND gate is inputted;

a pull-up circuit capable of charging a pull-up node from one side of the power supply, the pull-up node being connected with outputs of the coupling transistor and the NOR gate; and inverters to which a potential from the pull-up node is inputted.

3. The signal transition detection circuit of claim 2, wherein the first and the second AND gates are respectively formed such that a set of a first conduction type transistors are connected in series between the pull-up node and the other side of the power supply;

the first and the second OR gates are respectively formed such that a set of a second conduction type transistors is connected in series between the pull-up node and the other side of the power supply;

the pull-up circuit is composed of a second conduction type pull-up transistor which functions equivalently as a resistance; and the signal transition detection circuit further comprising a pull-down transistor capable of charging an output of the NAND gate as a pull-down node from the other side of the power supply, the pull-down transistor functioning equivalently as a resistance.

4. A signal transition detection circuit for generating first to fourth signals of four types in such a manner that delay times of the second to the fourth signals behind the first signal increases in the order from the second signal to the fourth signal, for detecting a first or a second predetermined combination of logic levels with respect to the first and the third signals or with respect to the second and the fourth signals, and for detecting transitions of a logic level of an input signal from one level to the other level or from another level to the one level, respectively, the signal transition detection circuit comprising:

a first detection circuit for detecting the first combination;

a second detection circuit for detecting the second combination;

a third detection circuit for detecting a third combination having different logic levels from those of the first combination with respect to the first and the third signals;

a fourth detection circuit for detecting a fourth combination having different logic levels from those of the second combination with respect to the second and the fourth signals; and an output circuit for outputting a predetermined logic. level only when at least one of the first to the fourth combinations is detected by the first to the fourth detection circuits;

wherein a signal b2 corresponding to the second signal, a signal c2 corresponding to the third signal, and a signal d2 corresponding to the fourth signal are delayed behind a signal a2 corresponding to the first signal by amounts corresponding to one inverted stage, two inverted stages and three inverted stages, respectively;

the first and third detection circuits are first XOR gates to which the signals a2 and c2 are inputted, respectively;

the second and fourth detection circuits are second XOR gates to which the signals b2 and d2 are inputted, respectively;

the output circuit includes:
  an AND gate to which an output of the first XOR gate and an output of the second XOR gate are inputted;
  a pull-up circuit capable of charging an output of the AND gate as a pull-up node from the one side of the power supply; and
  inverters to which a potential from the pull-up node is inputted.

5. The signal transition detection circuit of claim 4, wherein
  the pull-up circuit is composed of a pull-up transistor which functions equivalently as a resistance;
  the AND gate is equivalently formed by direct connecting an output of the first XOR gate with an output of the second XOR gate;
  each of the first and the second XOR gates includes two sets of series elements which are formed by connecting the transistors of the first and second conduction types in series so that the transistor of the first conduction type is arranged on the other side of the power supply and the transistor of the second conduction type is arranged on the AND gate side, and in each of the first and the second XOR gates, the first conduction type transistor of one of the two sets of series elements and the second conduction type transistor of the other of the two sets of series element are supplied with the same signal, and the second conduction type transistor of the one of the two sets of series elements and the first conduction type transistor of the other of the two sets of series elements are supplied with the same signal.

6. The signal transition detection circuit of claim 1, the signal transition detection circuit being formed in an integrated circuit for a semiconductor memory device, and being supplied with an address signal as the input signal.

7. The signal transition detection circuit of claim 6, wherein a latch circuit for the address signal is provided on the input side.

8. A signal transition detection circuit as claimed in claim 1, wherein said first and said second detection circuits generate a fifth and a sixth signal, respectively, and said third and fourth detection circuits output a seventh and an eighth signal, respectively, said seventh and eighth signals being inverted providing a ninth signal, said output circuit including a pull-up circuit for said fifth, sixth and ninth signals, and an inverter providing said predetermined logic level.

9. A signal transition detection circuit for detecting a change of a signal from a first level to a second level or from said second level to said first level and providing a transition detection signal, said signal having a predetermined minimum length, comprising
  a first and a second detection circuit each detecting the change of said signal from said first level to said second level and generating first and second output signals, a third and a fourth detection circuit each detecting the change of said signal from said second level to said first level and generating third and fourth output signals, said first, second, third, and fourth detection circuits including circuitry for sharing a pull-up circuit, said pull-up circuit performing an OR gate function on said first, second, third and fourth output signals and generating said transition detection signal;
wherein said first and second output signals are of different duration, and said third and fourth signals are of different duration, and wherein said transition detection signal has a length exceeding said minimum length of said signal.

10. A signal transition detection circuit for detecting a change of a signal as claimed in 9, wherein said first, second, third and fourth detection circuits include signal delay means for detecting said change of said signal at predetermined times after said transition.

11. A signal transition detection circuit for detecting a change of a signal as claimed in 8, wherein said signal transition circuit further including an inverter for receiving said transition detection signal and providing an inverted transition signal.

* * * * *